(12) United States Patent
Garcia

(10) Patent No.: US 7,862,663 B2
(45) Date of Patent: *Jan. 4, 2011

(54) METHODS FOR PROCESSING A SUBSTRATE WITH A FLOW CONTROLLED MENISCUS

(75) Inventor: James P. Garcia, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/381,643

(22) Filed: Mar. 13, 2009

(65) Prior Publication Data

US 2009/0176360 A1 Jul. 9, 2009

Related U.S. Application Data

(60) Division of application No. 10/957,260, filed on Sep. 30, 2004, now Pat. No. 7,520,285, and a continuation-in-part of application No. 10/261,839, filed on Sep. 30, 2002, now Pat. No. 7,234,477.

(51) Int. Cl.
*B08B 3/00* (2006.01)

(52) U.S. Cl. .............................. 134/34; 134/18; 134/42; 134/902

(58) Field of Classification Search .................... 134/18, 134/34, 42, 902
See application file for complete search history.

(56) References Cited

U.S. PATENT DOCUMENTS

| 6,398,975 | B1 * | 6/2002 | Mertens et al. | 216/92 |
| 6,988,327 | B2 * | 1/2006 | Garcia et al. | 34/407 |
| 7,143,527 | B2 * | 12/2006 | Garcia et al. | 34/380 |
| 7,329,321 | B2 * | 2/2008 | Yun et al. | 134/15 |
| 7,387,689 | B2 * | 6/2008 | de Larios et al. | 134/21 |
| 2002/0023671 | A1 * | 2/2002 | Mitsumori et al. | 134/151 |

* cited by examiner

*Primary Examiner*—Michael Barr
*Assistant Examiner*—Jason Heckert
(74) *Attorney, Agent, or Firm*—Martine Penilla & Gencarella, LLP

(57) ABSTRACT

A method for processing a substrate is provided which includes applying fluid onto a surface of the substrate from a portion of a plurality of inlets and removing at least the fluid from the surface of the substrate where the removing being processed as the fluid is applied to the surface. The applying the fluid and the removing the fluid forms a segment of a fluid meniscus on the surface of the substrate.

13 Claims, 31 Drawing Sheets

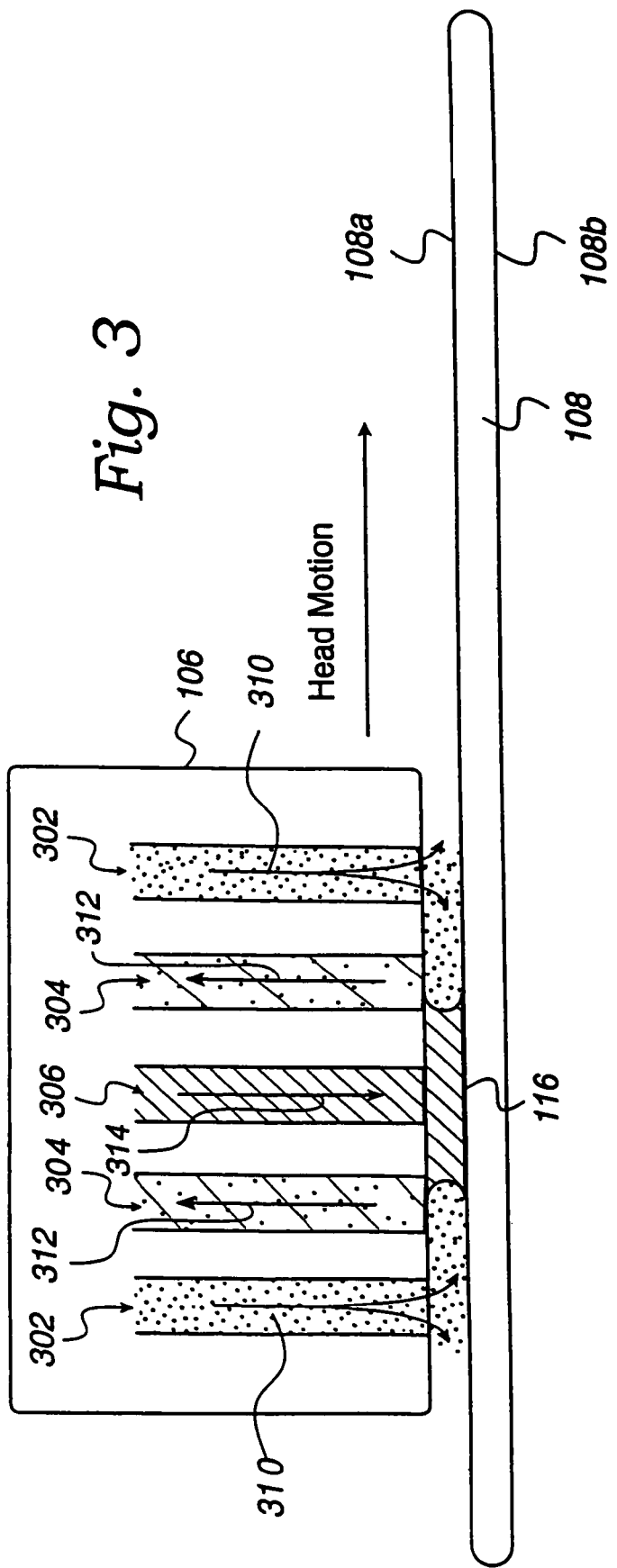

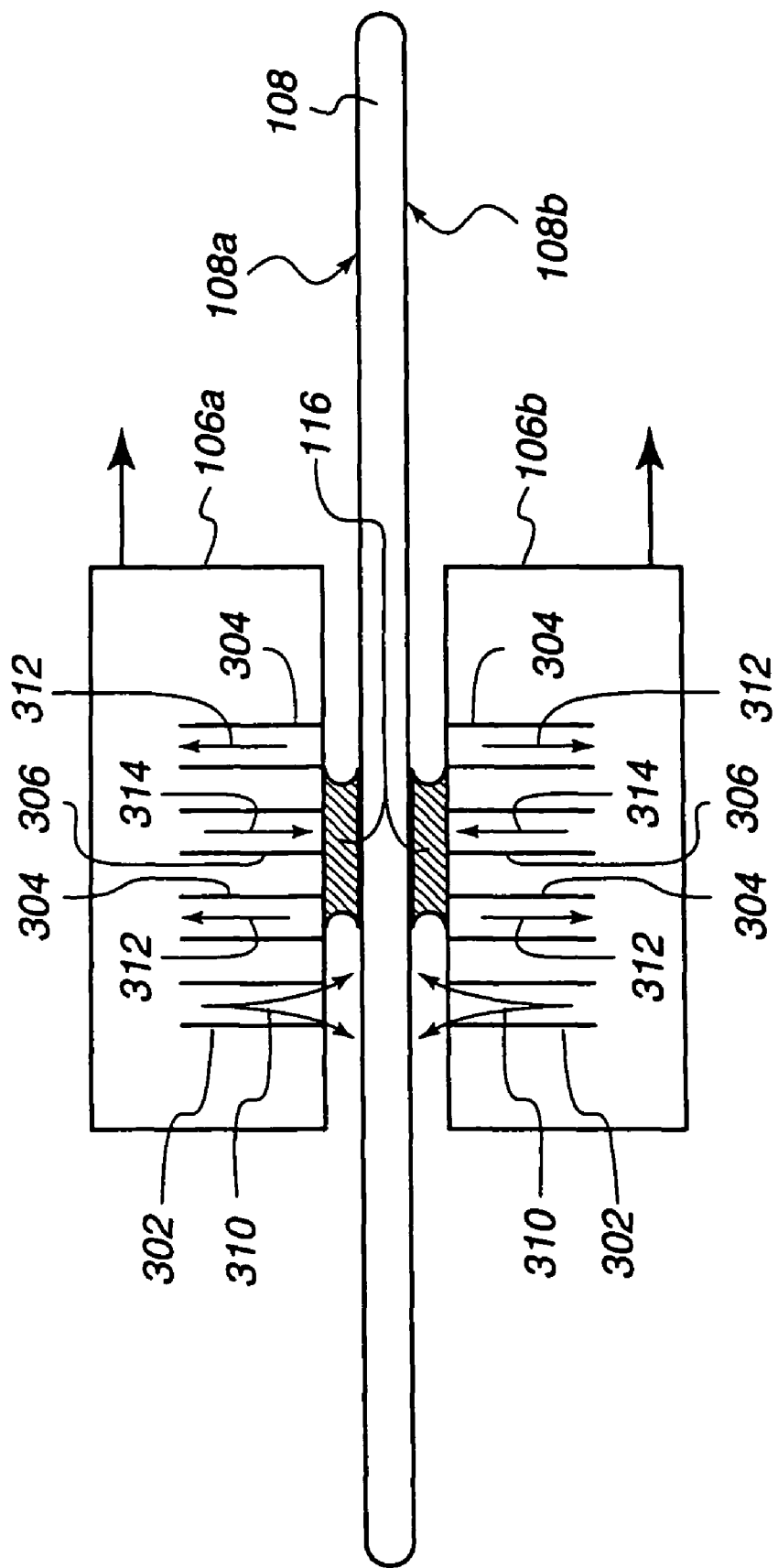

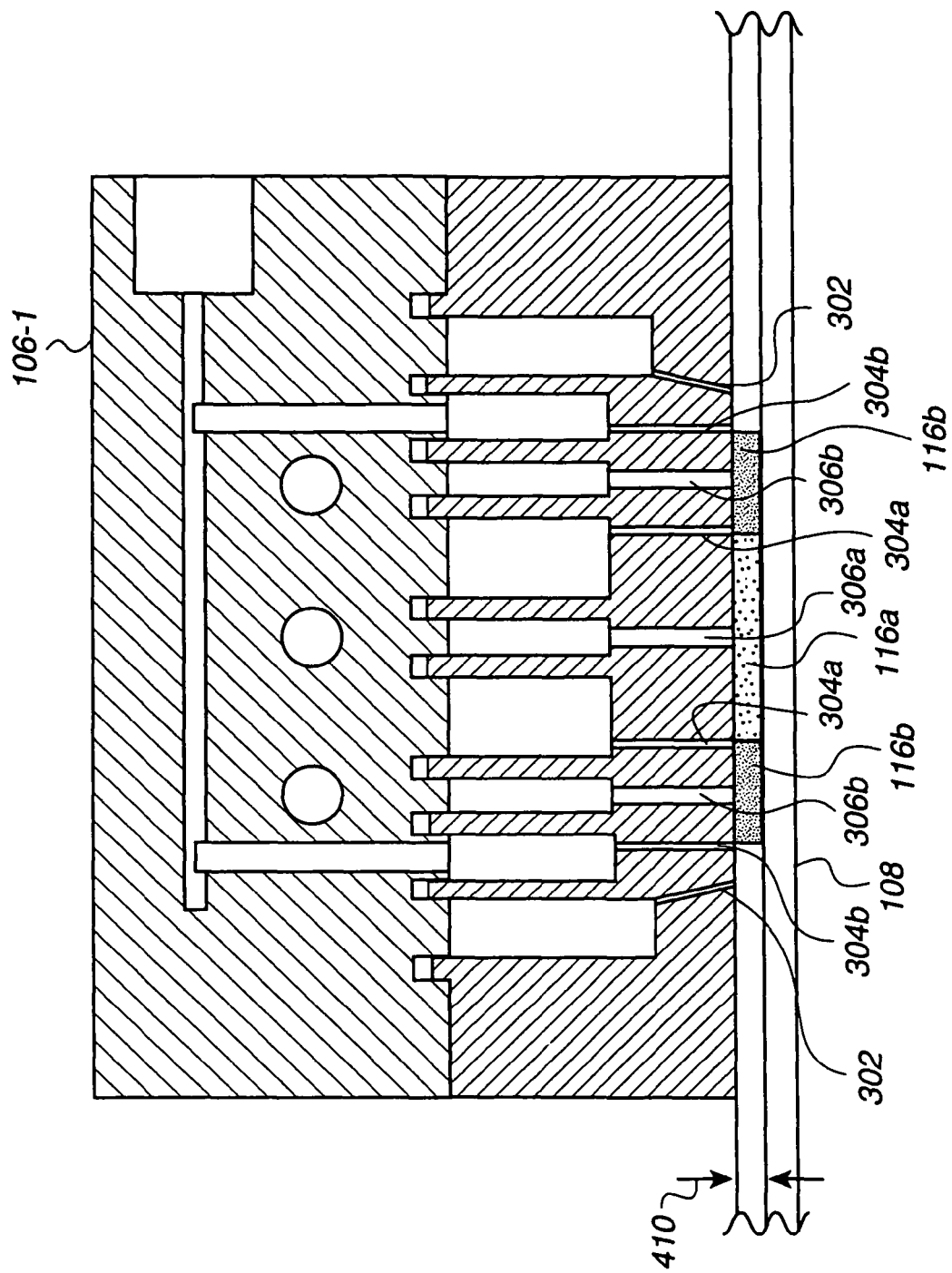

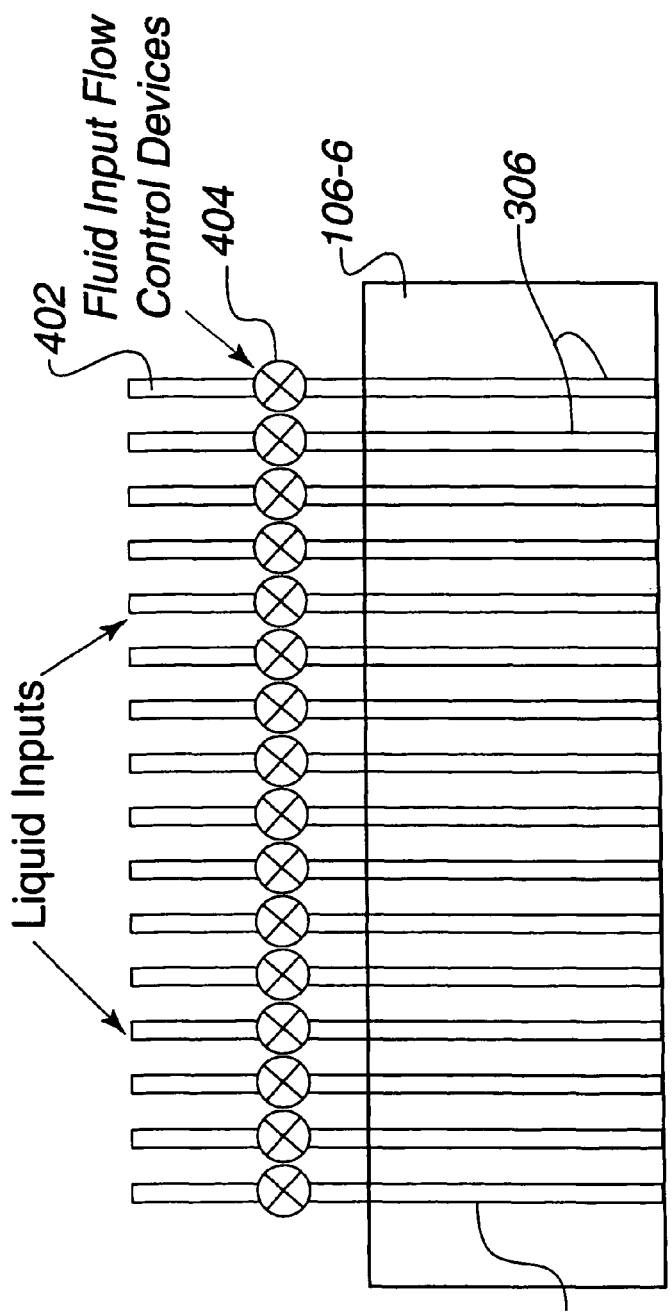
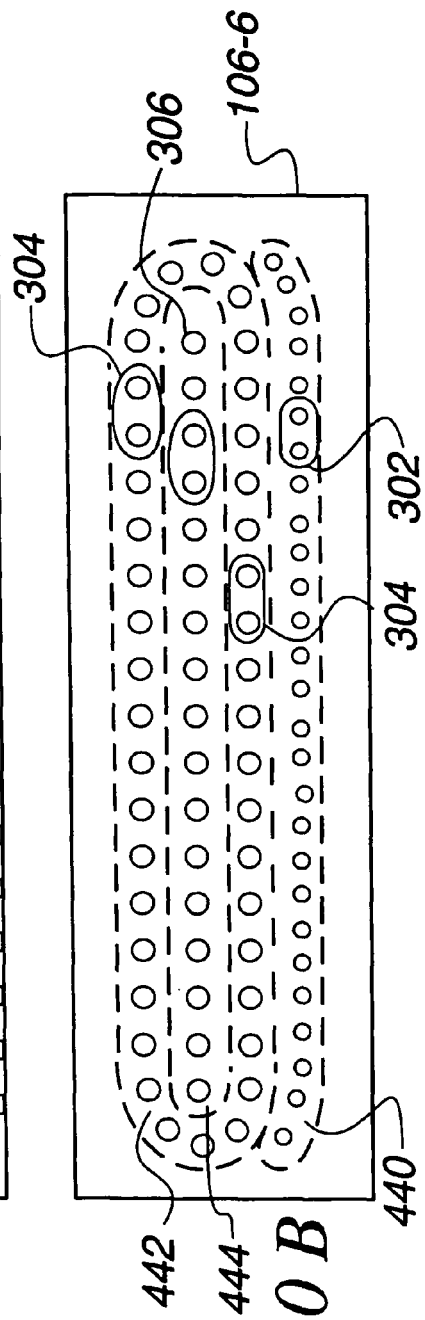
Fig. 10A
Fig. 10B

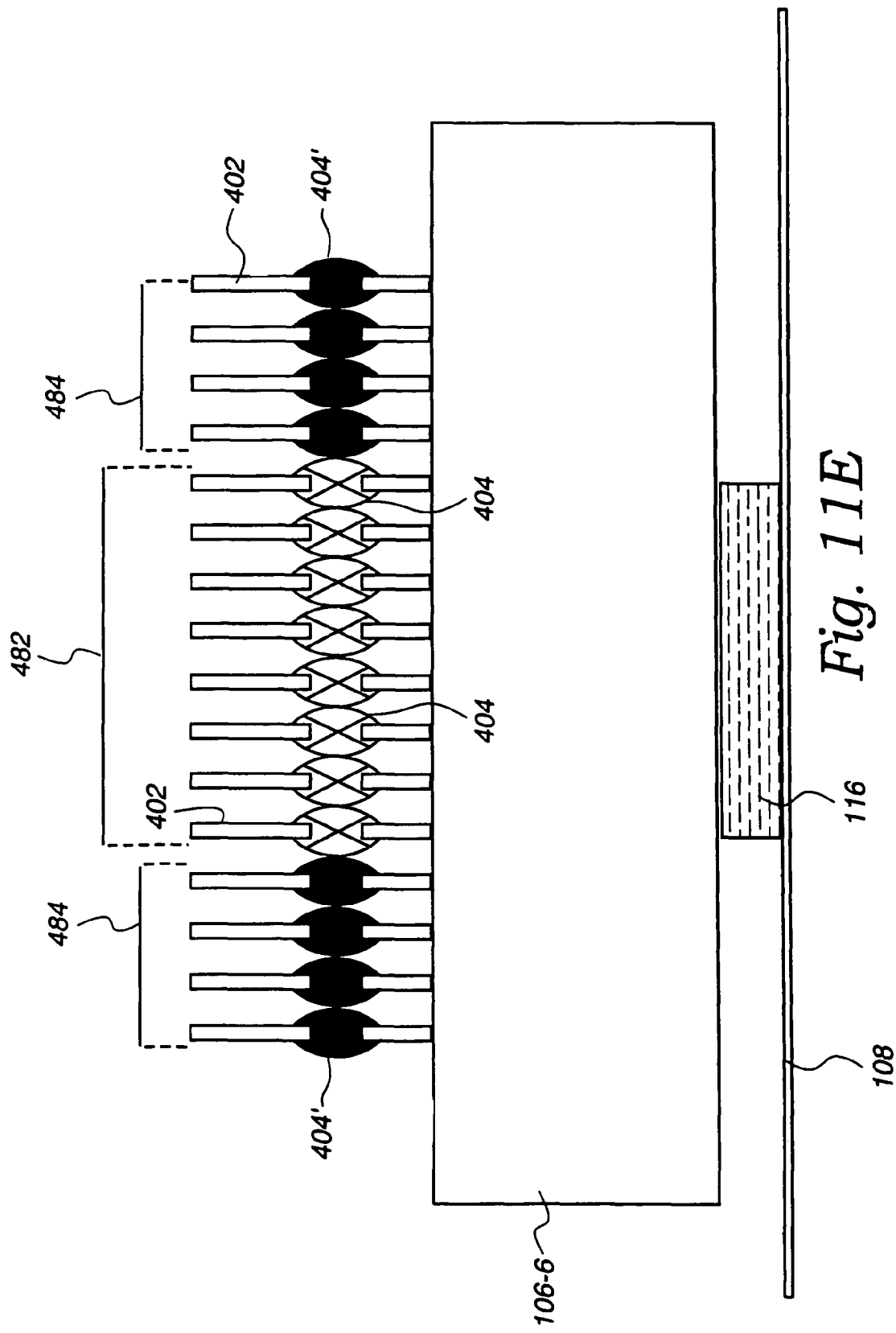

METHODS FOR PROCESSING A SUBSTRATE WITH A FLOW CONTROLLED MENISCUS

CLAIM OF PRIORITY

This application is a divisional application of U.S. patent application Ser. No. 10/957,260, filed on Sep. 30, 2004 now U.S. Pat. No. 7,520,285, entitled "APPARATUS AND METHOD FOR PROCESSING A SUBSTRATE", the disclosure of which is incorporated in its entirety herein by reference.

CROSS REFERENCE TO RELATED APPLICATION

This is a continuation-in-part of co-pending U.S. patent application Ser. No. 10/261,839 filed on Sep. 30, 2002 now U.S. Pat. No. 7,234,477 from which priority under 35 U.S.C. §120 is claimed and entitled "Method and Apparatus for Drying Semiconductor Wafer Surfaces Using a Plurality of Inlets and Outlets Held in Close Proximity to the Wafer Surfaces." The aforementioned patent application is hereby incorporated by reference in its entirety.

BACKGROUND OF THE INVENTION

1. Field of the Invention

The present invention relates to semiconductor wafer processing and, more particularly, to apparatuses and techniques for more efficiently applying and removing fluids from wafer surfaces while reducing contamination and decreasing wafer processing costs.

2. Description of the Related Art

In the semiconductor chip fabrication process, it is well-known that there is a need to process a wafer using operations such as cleaning and drying. In each of these types of operations, there is a need to effectively apply and remove fluids for the wafer operation process.

For example, wafer cleaning may have to be conducted where a fabrication operation has been performed that leaves unwanted residues on the surfaces of wafers. Examples of such a fabrication operation include plasma etching (e.g., tungsten etch back (WEB)) and chemical mechanical polishing (CMP). In CMP, a wafer is placed in a holder which pushes a wafer surface against a rolling conveyor belt. This conveyor belt uses a slurry which consists of chemicals and abrasive materials to cause the polishing. Unfortunately, this process tends to leave an accumulation of slurry particles and residues at the wafer surface. If left on the wafer, the unwanted residual material and particles may cause, among other things, defects such as scratches on the wafer surface and inappropriate interactions between metallization features. In some cases, such defects may cause devices on the wafer to become inoperable. In order to avoid the undue costs of discarding wafers having inoperable devices, it is therefore necessary to clean the wafer adequately yet efficiently after fabrication operations that leave unwanted residues.

After a wafer has been wet cleaned, the wafer must be dried effectively to prevent water or cleaning fluid remnants from leaving residues on the wafer. If the cleaning fluid on the wafer surface is allowed to evaporate, as usually happens when droplets form, residues or contaminants previously dissolved in the cleaning fluid will remain on the wafer surface after evaporation (e.g., and form water spots). To prevent evaporation from taking place, the cleaning fluid must be removed as quickly as possible without the formation of droplets on the wafer surface. In an attempt to accomplish this, one of several different drying techniques are employed such as spin drying, IPA, or Marangoni drying. All of these drying techniques utilize some form of a moving liquid/gas interface on a wafer surface which, if properly maintained, results in drying of a wafer surface without the formation of droplets. Unfortunately, if the moving liquid/gas interface breaks down, as often happens with all of the aforementioned drying methods, droplets form and evaporation occurs resulting in contaminants being left on the wafer surface. The most prevalent drying technique used today is spin rinse drying (SRD).

FIG. 1A illustrates movement of fluids on a wafer 10 during an SRD process. In this drying process, a wet wafer is rotated at a high rate by rotation 14. In SRD, by use of centrifugal force, the fluid used to rinse the wafer is pulled from the center of the wafer to the outside of the wafer and finally off of the wafer as shown by fluid directional arrows 16. As the fluid is being pulled off of the wafer, a moving liquid/gas interface 12 is created at the center of the wafer and moves to the outside of the wafer (i.e., the circle produced by the moving liquid/gas interface 12 gets larger) as the drying process progresses. In the example of FIG. 1A, the inside area of the circle formed by the moving liquid/gas interface 12 is free from the fluid and the outside area of the circle formed by the moving liquid/gas interface 12 is the fluid. Therefore, as the drying process continues, the section inside (the dry area) of the moving liquid/gas interface 12 increases while the area (the wet area) outside of the moving liquid/gas interface 12 decreases. As stated previously, if the moving liquid/gas interface 12 breaks down, droplets of the fluid form on the wafer and contamination may occur due to evaporation of the droplets. As such, it is imperative that droplet formation and the subsequent evaporation be limited to keep contaminants off of the wafer surface. Unfortunately, the present drying methods are only partially successful at the prevention of moving liquid interface breakdown.

In addition, the SRD process has difficulties with drying wafer surfaces that are hydrophobic. Hydrophobic wafer surfaces can be difficult to dry because such surfaces repel water and water based (aqueous) cleaning solutions. Therefore, as the drying process continues and the cleaning fluid is pulled away from the wafer surface, the remaining cleaning fluid (if aqueous based) will be repelled by the wafer surface. As a result, the aqueous cleaning fluid will want the least amount of area to be in contact with the hydrophobic wafer surface. Additionally, the aqueous cleaning solution tends cling to itself as a result of surface tension (i.e., as a result of molecular hydrogen bonding). Therefore, because of the hydrophobic interactions and the surface tension, balls (or droplets) of aqueous cleaning fluid forms in an uncontrolled manner on the hydrophobic wafer surface. This formation of droplets results in the harmful evaporation and the contamination discussed previously. The limitations of the SRD are particularly severe at the center of the wafer, where centrifugal force acting on the droplets is the smallest. Consequently, although the SRD process is presently the most common way of wafer drying, this method can have difficulties reducing formation of cleaning fluid droplets on the wafer surface especially when used on hydrophobic wafer surfaces. Certain portion of the wafer may have different hydrophobic properties.

FIG. 1B illustrates an exemplary wafer drying process 18. In this example a portion 20 of the wafer 10 has a hydrophilic area and a portion 22 has a hydrophobic area. The portion 20 attracts water so a fluid 26 pools in that area. The portion 22 is hydrophobic so that area repels water and therefore there can be a thinner film of water on that portion of the wafer 10. Therefore, the hydrophobic portions of the wafer 10 often dry more quickly than the hydrophilic portions. This may lead to inconsistent wafer drying that can increase contamination levels and therefore decrease wafer production yields.

Therefore, there is a need for a method and an apparatus that avoids the prior art by enabling optimized fluid management and application to a wafer that reduces contaminating deposits on the wafer surface. Such deposits as often occurs today reduce the yield of acceptable wafers and increase the cost of manufacturing semiconductor wafers.

SUMMARY OF THE INVENTION

Broadly speaking, the present invention fills these needs by providing a substrate processing apparatus that is capable of processing wafer surfaces while significantly reducing wafer contamination. It should be appreciated that the present invention can be implemented in numerous ways, including as a process, an apparatus, a system, a device or a method. Several inventive embodiments of the present invention are described below.

In one embodiment, a method for processing a substrate is provided which includes applying fluid onto a surface of the substrate from a portion of a plurality of inlets and removing at least the fluid from the surface of the substrate where the removing being processed as the fluid is applied to the surface. The applying the fluid and the removing the fluid forms a segment of a fluid meniscus on the surface of the substrate.

In another embodiment, an apparatus for processing a substrate is provided which includes a proximity head having a plurality of conduits and a fluid input coupled to the proximity head and supplies fluid to a corresponding one of a plurality of conduits where the corresponding one of the plurality of conduits uses the fluid to generate a segment of a fluid meniscus on a surface of the substrate. The apparatus also includes a fluid flow control mechanism for managing fluid flow through the fluid input.

In yet another embodiment, a system for processing a substrate is provided which includes a proximity head configured to generate at least one segment of a fluid meniscus and a fluid input coupled to the proximity head, the fluid input configured to provide fluid to the proximity head. The system also includes a fluid supply coupled to the fluid input where the fluid supply supplies the fluid to the fluid input.

The advantages of the present invention are numerous. Most notably, the apparatuses and methods described herein utilize a method and apparatus to intelligently and powerfully manage meniscus size and shape to efficiently process (e.g., clean, dry, etc.) substrates. Therefore, the operations can utilize optimal management of fluid application and removal from the substrate while reducing unwanted fluids and contaminants remaining on a wafer surface. Consequently, wafer processing and production may be increased and higher wafer yields may be achieved due to efficient wafer processing.

The present invention enables optimal wafer processing through the powerful and intelligent management of fluid input into each of the source inlets of the proximity head. By managing each input or series of inputs, fluid being applied from each source inlet to the wafer surface may be controlled in an intelligent manner. By controlling the fluid applied from the each of the source inlets, the size and shape of the meniscus may be adjusted depending on the wafer processing operation desired. In one embodiment, the flow through each of the inputs supplying the source inlets may be adjusted by use of a flow control device. In additional embodiments, any suitable number of menisci may be concentric to and/or surround each other.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

FIG. 3 illustrates a proximity head performing a wafer processing operation in accordance with one embodiment of the present invention.

FIG. 4B illustrates a side view of exemplary proximity heads for use in a dual wafer surface processing system in accordance with one embodiment of the present invention.

FIG. 5B shows a cross section view of the multi-menisci proximity head in accordance with one embodiment of the present invention.

FIG. 10A illustrates a side view of a proximity head with fluid inputs in accordance with one embodiment of the present invention.

FIG. 10B shows a face view of a processing region of the proximity head in accordance with one embodiment of the present invention.

FIG. 11E illustrates the proximity head as discussed in FIG. 11D in operation where the region shows fluid inputs which have their respective fluid flow control devices turned off and the region shows fluid input which have their respective fluid flow control devices turned on in accordance with one embodiment of the present invention.

DETAILED DESCRIPTION

Figure 1A:
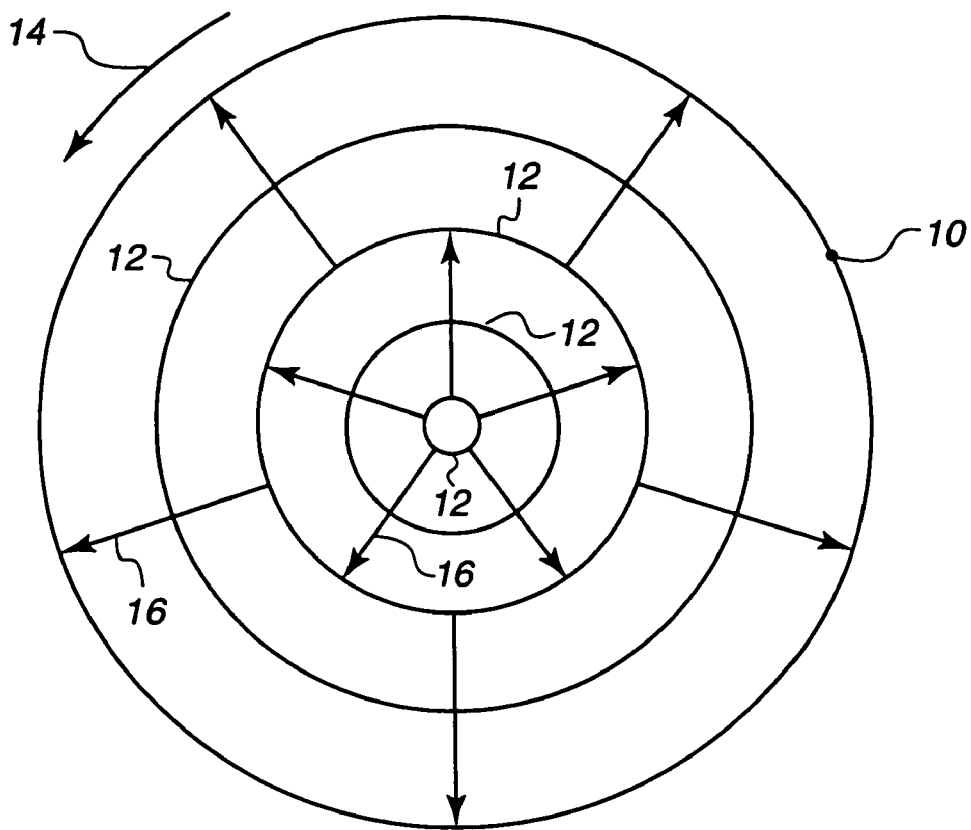
FIG. 1A illustrates movement of cleaning fluids on a wafer during an SRD drying process.

An invention for methods and apparatuses for processing a substrate is disclosed. In the following description, numerous specific details are set forth in order to provide a thorough understanding of the present invention. It will be understood; however, by one of ordinary skill in the art, that the present invention may be practiced without some or all of these specific details. In other instances, well known process operations have not been described in detail in order not to unnecessarily obscure the present invention.

While this invention has been described in terms of several preferable embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

The figures below illustrate embodiments of an exemplary wafer processing system using proximity heads with variable flow inputs into the source inlets to generate one or more of a specific shape, size, and location of fluid menisci. In another embodiment, both fluid input into source inlets and fluid output from source outlets may be managed. This technology may be utilized to perform any suitable type of combination of types of wafer operation(s) such as, for example, drying, etching, plating, etc. It should be appreciated that the systems and proximity heads as described herein are exemplary in nature, and that any other suitable types of configurations that would enable the generation and movement of two or more menisci that are in contact as described herein may be utilized.

In the embodiments shown, the proximity head(s) may move or stay stationary depending on the embodiment utilized. In one embodiment, the proximity head(s) may stay stationary and by controlling the fluid applied to the wafer from the source inlets, segments of the fluid meniscus may be either generated or removed. Therefore, depending on the proximity head size and wafer size, movement of the proximity head(s) for wafer processing may not be necessary. In another embodiment, the proximity head(s) may stay stationary but the wafer may be moved. In yet another embodiment, the proximity head(s) may move in a linear fashion from a center portion of the wafer to the edge of the wafer. It should be appreciated that other embodiments may be utilized where the proximity head(s) move in a linear fashion from one edge of the wafer to another diametrically opposite edge of the wafer, or other non-linear movements may be utilized such as, for example, in a radial motion, in a circular motion, in a spiral motion, in a zig-zag motion, in a random motion, etc. In addition, the motion may also be any suitable specified motion profile as desired by a user. In addition, in one embodiment, the wafer may be rotated and the proximity head moved in a linear fashion so the proximity head may process all portions of the wafer. It should also be understood that other embodiments may be utilized where the wafer is not rotated but the proximity head is configured to move over the wafer in a fashion that enables processing of all portions of the wafer.

In addition, the proximity head and the wafer processing system as described herein may be utilized to process any shape and size of substrates such as for example, 200 mm wafers, 300 mm wafers, flat panels, etc. Moreover, the size of the proximity head and in turn the sizes of the menisci may vary. In one embodiment, the size of the proximity head and the sizes of the menisci may be larger than a wafer being processed. In such an embodiment, by generating and shutting off certain segments of the meniscus, a part of or all of the wafer may be processed by the meniscus. In another embodiment, the proximity head and the sizes of the menisci may be smaller than the wafer being processed. Furthermore, the menisci as discussed herein may be utilized with other forms of wafer processing technologies such as, for example, brushing, lithography, megasonics, etc.

A fluid meniscus can be generated, supported, and moved (e.g., onto, off of and across a wafer) with a proximity head. Various proximity heads and methods of using the proximity heads are described in co-owned U.S. patent application Ser. No. 10/834,548 filed on Apr. 28, 2004 and entitled "Apparatus and Method for Providing a Confined Liquid for Immersion Lithography," which is a continuation in part of U.S. patent application Ser. No. 10/606,022, filed on Jun. 24, 2003 and entitled "System And Method For Integrating In-Situ Metrology Within A Wafer Process" which is a continuation-in-part of U.S. patent application Ser. No. 10/330,843 filed on Dec. 24, 2002 and entitled "Meniscus, Vacuum, EPA Vapor, Drying Manifold," which is a continuation-in-part of U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces," both of which are incorporated herein by reference in its entirety. Additional embodiments and uses of the proximity head are also disclosed in U.S. patent application Ser. No. 10/330,897, filed on Dec. 24, 2002, entitled "System for Substrate Processing with Meniscus, Vacuum, EPA vapor, Drying Manifold" and U.S. patent application Ser. No. 10/404,692, filed on Mar. 31, 2003, entitled "Methods and Systems for Processing a Substrate Using a Dynamic Liquid Meniscus." Still additional embodiments of the proximity head are described in U.S. patent application Ser. No. 10/404,270, filed on Mar. 31, 2003, entitled "Vertical Proximity Processor," U.S. patent application Ser. No. 10/603,427, filed on Jun. 24, 2003, and entitled "Methods and Systems for Processing a Bevel Edge of a Substrate Using a Dynamic Liquid Meniscus," U.S. patent application Ser. No. 10/606,022, filed on Jun. 24, 2003, and entitled "System and Method for Integrating In-Situ Metrology within a Wafer Process," U.S. patent application Ser. No. 10/607,611 filed on Jun. 27, 2003 entitled "Apparatus and Method for Depositing and Planarizing Thin Films of Semiconductor Wafers," U.S. patent application Ser. No. 10/611,140 filed on Jun. 30, 2003 entitled "Method and Apparatus for Cleaning a Substrate Using Megasonic Power," U.S. patent application Ser. No. 10/817,398 filed on Apr. 1, 2004 entitled "Controls of Ambient Environment During Wafer Drying Using Proximity Head," U.S. patent application Ser. No. 10/817,355 filed on Apr. 1, 2004 entitled "Substrate Proximity Processing Structures and Methods for Using and Making the Same," U.S. patent application Ser. No. 10/817,620 filed on Apr. 1, 2004 entitled "Substrate Meniscus Interface and Methods for Operation," U.S. patent application Ser. No. 10/817,133 filed on Apr. 1, 2004 entitled "Proximity Meniscus Manifold," U.S. Pat. No. 6,488,040, issued on Dec. 3, 2002, entitled "Capillary Proximity Heads For Single Wafer Cleaning And Drying," U.S. Pat. No. 6,616,772, issued on Sep. 9, 2003, entitled "Methods For Wafer Proximity Cleaning And Drying," and U.S. patent application Ser. No. 10/742,303 entitled "Proximity Brush Unit Apparatus and Method." Additional embodiments and uses of the proximity head are further described in U.S. patent application Ser. No. 10/883,301 entitled "Concentric Proximity Processing Head," and U.S. patent application Ser. No. 10/882,835 entitled "Method and Apparatus for Processing Wafer Surfaces Using Thin, High Velocity Fluid Layer." The aforementioned patent applications are hereby incorporated by reference in their entirety.

It should be appreciated that the system described herein is just exemplary in nature, and the proximity head described herein may be used in any suitable system such as, for example, those described in the United States patent applications referenced above. It should also be appreciated that FIGS. 2 through 4B describe formation of a single meniscus and therefore process variables (e.g. flow rates, dimensions, etc.) described therein may be different than the process variables described for a multi-menisci proximity head as described in FIG. 5A through 9 or the process variables for generating segments of menisci as described in FIGS. 10 through 15. Regardless, it should be understood that control and management of fluid flow into the proximity head may be managed in any suitable type of proximity head configured to generate any suitable type of fluid meniscus.

Figure 2:
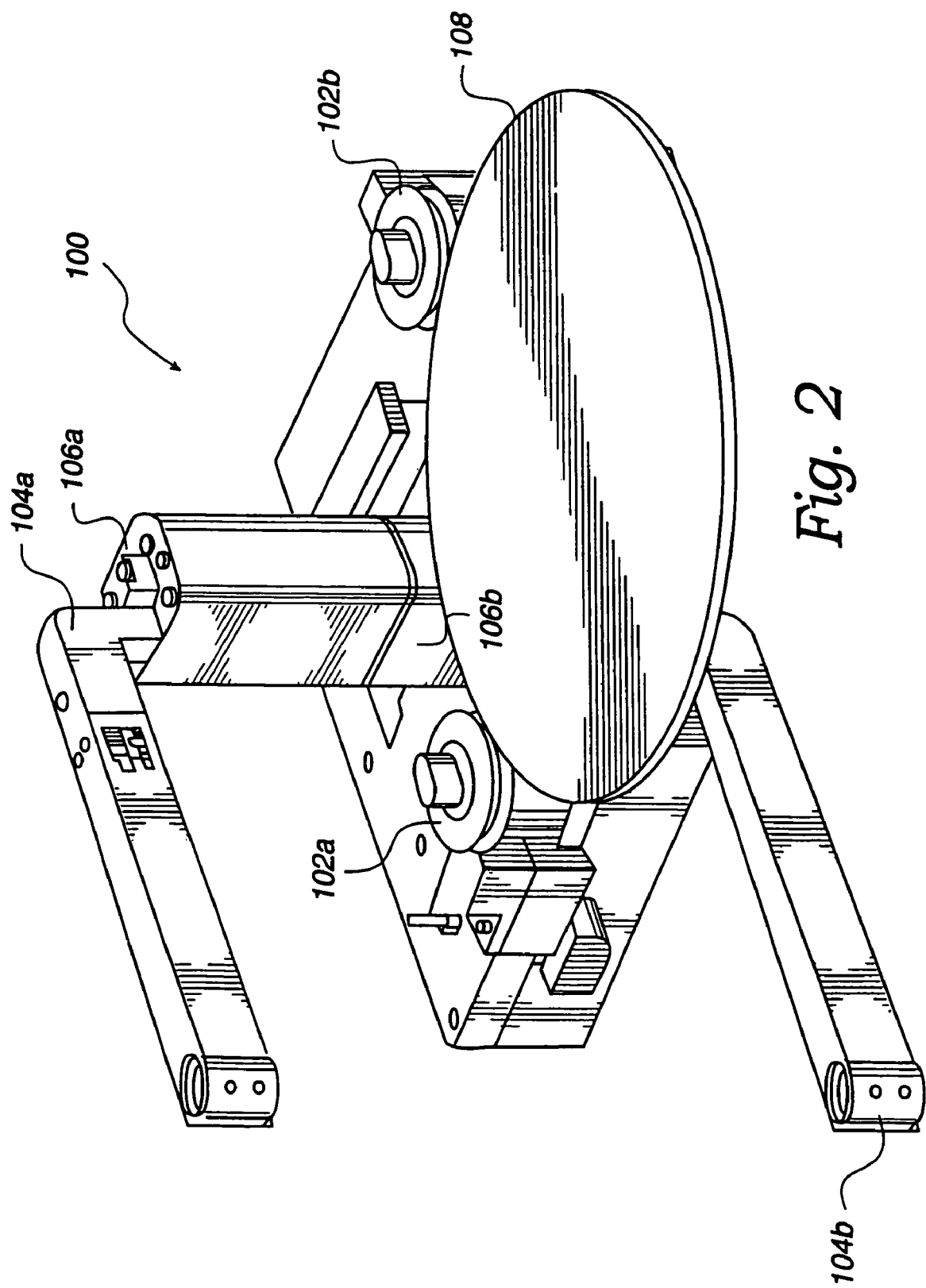
FIG. 2 shows a wafer processing system in accordance with one embodiment of the present invention.

FIG. 2 shows a wafer processing system 100 in accordance with one embodiment of the present invention. The system 100 includes rollers 102a and 102b which may hold and/or rotate a wafer to enable wafer surfaces to be processed. The system 100 also includes proximity heads 106a and 106b that, in one embodiment, are attached to an upper arm 104a and to a lower arm 104b respectively. In one embodiment, the proximity heads 106a and/or 106b may be any suitable proximity head as described in further detail herein. The proximity heads 106a and 106b may generate a single meniscus or may generate multiple menisci. Therefore, the proximity heads 106a and 106b, in one embodiment, may be a single meniscus proximity head or a multi-menisci proximity head or a combination of both where one of the proximity heads 106a and 106b is a single meniscus proximity head and the other is a multi-menisci proximity head. As described herein the term "multi-menisci proximity head" is a proximity head capable of generating one or more fluid menisci. In a one embodiment of a multi-menisci proximity head, a first fluid meniscus is substantially surrounded by a second fluid meniscus and in another embodiment, the first fluid meniscus is located alongside the second fluid meniscus. The proximity head may be any suitable apparatus that may generate a fluid meniscus as described herein and described in the patent application incorporated by reference above. The upper arm 104a and the lower arm 104b can be part of an assembly which enables substantially linear movement (or in another embodiment a slight arc-like movement) of the proximity heads 106a and 106b along a radius of the wafer. In yet another embodiment, the assembly may move the proximity heads 106a and 106b in any suitable user defined movement.

In one embodiment the arms 104 are configured to hold the proximity head 106a above the wafer and the proximity head 106b below the wafer in close proximity to the wafer. For example, in one exemplary embodiment this may be accomplished by having the upper arm 104a and the lower arm 104b be movable in a vertical manner so once the proximity heads are moved horizontally into a location to start wafer processing, the proximity heads 106a and 106b can be moved vertically to a position in close proximity to the wafer. In another embodiment, the upper arm 104a and the lower arm 104b may be configured to start the proximity heads 106a and 106b in a position where the menisci are generated before processing and the menisci that has already been generated between the proximity heads 106a and 106 may be moved onto the wafer surface to be processed from an edge area of a wafer 108. Therefore, the upper arm 104a and the lower arm 104b may be configured in any suitable way so the proximity heads 106a and 106b can be moved to enable wafer processing as described herein. It should also be appreciated that the system 100 may be configured in any suitable manner as long as the proximity head(s) may be moved in close proximity to the wafer to generate and control one or more menisci that, in one embodiment, are concentric with each other. It should also be understood that close proximity may be any suitable distance from the wafer as long as a menisci may be maintained. In one embodiment, the proximity heads 106a and 106b (as well as any other proximity head described herein) may each be located between about 0.1 mm to about 10 mm from the wafer to generate the fluid menisci on the wafer surface. In a preferable embodiment, the proximity heads 106a and 106b (as well as any other proximity head described herein) may each be located bout 0.5 mm to about 2.0 mm from the wafer to generate the fluid menisci on the wafer surface, and in more preferable embodiment, the proximity heads 106a and 106b (as well as any other proximity head described herein) may be located about 1.5 mm from the wafer to generate the fluid menisci on the wafer surface.

In one embodiment, the system 100, the arms 104 are configured to enable the proximity heads 106a and 106b to be moved from processed to unprocessed portions of the wafer. It should be appreciated that the arms 104 may be movable in any suitable manner that would enable movement of the proximity heads 106a and 106b to process the wafer as desired. In one embodiment, the arms 104 may be motivated by a motor to move the proximity head 106a and 106b along the surface of the wafer. It should be understood that although the wafer processing system 100 is shown with the proximity heads 106a and 106b, that any suitable number of proximity heads may be utilized such as, for example, 1, 2, 3, 4, 5, 6, etc. The proximity heads 106a and/or 106b of the wafer processing system 100 may also be any suitable size or shape as shown by, for example, any of the proximity heads as described herein. The different configurations described herein generate the fluid menisci between the proximity head and the wafer. The fluid menisci may be moved across the wafer to process the wafer by applying fluid to the wafer surface and removing fluids from the surface. In such a way, depending on the fluids applied to the wafer, cleaning, drying, etching, and/or plating may be accomplished. In addition, the first fluid meniscus may conduct one type of operation and the second fluid meniscus that at least partially surrounds the first fluid meniscus may conduct the same operation or a different wafer processing operation as the first fluid meniscus. Therefore, the proximity heads 106a and 106b can have any numerous types of configurations as shown herein or other configurations that enable the processes described herein. It should also be appreciated that the system 100 may process one surface of the wafer or both the top surface and the bottom surface of the wafer.

In addition, besides processing the top and/or bottom surfaces of the wafer, the system 100 may also be configured to process one side of the wafer with one type of process (e.g., etching, cleaning, drying, plating, etc.) and process the other side of the wafer using the same process or a different type of process by inputting and outputting different types of fluids or by using a different configuration menisci. The proximity heads can also be configured to process the bevel edge of the wafer in addition to processing the top and/or bottom of the wafer. This can be accomplished by moving the menisci off (or onto) the edge the wafer which processes the bevel edge. It should also be understood that the proximity heads 106a and 106b may be the same type of apparatus or different types of proximity heads.

The wafer 108 may be held and rotated by the rollers 102a and 102b in any suitable orientation as long as the orientation enables a desired proximity head to be in close proximity to a portion of the wafer 108 that is to be processed. In one embodiment, the rollers 102a and 102b can rotate in a clockwise direction to rotate the wafer 108 in a counterclockwise direction. It should be understood that the rollers may be rotated in either a clockwise or a counterclockwise direction depending on the wafer rotation desired. In one embodiment, the rotation imparted on the wafer 108 by the rollers 102a and 102b serves to move a wafer area that has not been processed into close proximity to the proximity heads 106a and 106b. However, the rotation itself does not dry the wafer or move fluid on the wafer surfaces towards the edge of the wafer. Therefore, in an exemplary wafer processing operation, the unprocessed areas of the wafer would be presented to the proximity heads 106a and 106b through both the linear motion of the proximity heads 106a and 106b and through the rotation of the wafer 108. The wafer processing operation itself may be conducted by at least one of the proximity heads. Consequently, in one embodiment, processed portions of the wafer 108 would expand from a center region to the edge region of the wafer 108 in a spiral movement as the processing operation progresses. In another embodiment, when the proximity heads 106a and 106b are moved from the periphery of the wafer 108 to the center of the wafer 108, the processed portions of the wafer 108 would expand from the edge region of the wafer 108 to the center region of the wafer 108 in a spiral movement.

In an exemplary processing operation, it should be understood that the proximity heads 106a and 106b may be configured to dry, clean, etch, and/or plate the wafer 108. In an exemplary drying embodiment, the at least one of first inlet may be configured to input deionized water (DIW) (also known as a DIW inlet), the at least one of a second inlet may be configured to input $N_2$ carrier gas containing isopropyl alcohol (IPA) in vapor form (also known as IPA inlet), and the at least one outlet may be configured to remove fluids from a region between the wafer and a particular proximity head by applying vacuum (also known as vacuum outlet). It should be appreciated that although IPA vapor is used in some of the exemplary embodiments, any other type of vapor may be utilized such as for example, nitrogen, any suitable alcohol vapor, organic compounds, volatile chemicals, etc. that may be miscible with water.

In an exemplary cleaning embodiment, a cleaning solution may be substituted for the DIW. An exemplary etching embodiment may be conducted where an etchant may be substituted for the DIW. In an additional embodiment, plating may be accomplished as described in further detail in reference to U.S. patent application Ser. No. 10/607,611 filed on Jun. 27, 2003 entitled "Apparatus and Method for Depositing and Planarizing Thin Films of Semiconductor Wafers" which was incorporated by reference above. In addition, other types of solutions may be inputted into the first inlet and the second inlet depending on the processing operation desired.

It should be appreciated that the inlets and outlets located on a face of the proximity head may be in any suitable configuration as long as stable menisci as described herein may be utilized. In one embodiment, the at least one $N_2$/IPA vapor inlet may be adjacent to the at least one vacuum outlet which is in turn adjacent to the at least one processing fluid inlet to form an IPA-vacuum-processing fluid orientation. Such a configuration can generate an outside meniscus that at least partially surrounds the inside meniscus. In addition, the inside meniscus may be generated through a configuration with a processing fluid-vacuum orientation. Therefore, one exemplary embodiment where a second fluid meniscus at least partially surrounds a first fluid meniscus may be generated by an IPA-vacuum-second processing fluid-vacuum-first processing fluid-vacuum-second processing fluid-vacuum-IPA orientation as described in further detail below. It should be appreciated that other types of orientation combinations such as IPA-processing fluid-vacuum, processing fluid-vacuum-IPA, vacuum-IPA-processing fluid, etc. may be utilized depending on the wafer processes desired and what type of wafer processing mechanism is sought to be enhanced. In one embodiment, the IPA-vacuum-processing fluid orientation in the form described herein may be utilized to intelligently and powerfully generate, control, and move the menisci located between a proximity head and a wafer to process wafers. The processing fluid inlets, the $N_2$/IPA vapor inlets, and the vacuum outlets may be arranged in any suitable manner if the above orientation or any other suitable orientation that can generate a fluid meniscus is maintained. For example, in addition to the $N_2$/IPA vapor inlet, the vacuum outlet, and the processing fluid inlet, in an additional embodiment, there may be additional sets of IPA vapor outlets, processing fluid inlets and/or vacuum outlets depending on the configuration of the proximity head desired. It should be appreciated that the exact configuration of the inlet and outlet orientation may be varied depending on the application. For example, the distance between the IPA input, vacuum, and processing fluid inlet locations may be varied so the distances are consistent or so the distances are inconsistent. In addition, the distances between the IPA input, vacuum, and processing fluid outlet may differ in magnitude depending on the size, shape, and configuration of the proximity head 106a and the desired size of a process menisci (i.e., menisci shape and size). In addition, exemplary IPA-vacuum-processing fluid orientation may be found as described in the United States patent applications referenced above.

In one embodiment, the proximity heads 106a and 106b may be positioned in close proximity to a top surface and a bottom surface respectively of the wafer 108 and may utilize the IPA (optionally) and processing fluid inlets and a vacuum outlets as described in further detail below to generate wafer processing menisci in contact with the wafer 108 which are capable of processing the top surface and the bottom surface of the wafer 108. The wafer processing menisci may be generated in a manner consistent with the descriptions in reference to Applications referenced and incorporated by reference above. At substantially the same time the IPA and the processing fluid is inputted, a vacuum may be applied in close proximity to the wafer surface to remove the IPA vapor, the processing fluid, and/or the fluids that may be on the wafer surface. It should be appreciated that although IPA is utilized in the exemplary embodiment, any other suitable type of vapor may be utilized such as for example, nitrogen, any suitable alcohol vapor, organic compounds, hexanol, ethyl glycol, acetone, etc. that may be miscible with water. These fluids may also be known as surface tension changing (e.g. reducing) fluids. It should also be appreciated that depending on the configuration of the proximity head 106, the IPA inlets may not be required and just the application of the processing fluid to the wafer and removal of the processing fluid may generate a stable fluid meniscus. The portion of the processing fluid that is in the region between the proximity head and the wafer is the meniscus. It should be appreciated that as used herein, the term "output" can refer to the removal of fluid from a region between the wafer 108 and a particular proximity head, and the term "input" can be the introduction of fluid to the region between the wafer 108 and the particular proximity head. In another embodiment, the proximity heads 106a and 106b may be scanned over the wafer 108 while being moved at the end of an arm that is being moved in a slight arc.

FIG. 3 illustrates a proximity head 106 performing a wafer processing operation in accordance with one embodiment of the present invention. FIGS. 3 through 4B show a method of generating a basic fluid meniscus while FIGS. 5A through 15 discuss apparatuses and methods for generating a more complex menisci configuration. FIGS. 10 through 15 show embodiments where inputs into the proximity head can vary fluid input into the source inlets of the proximity head. The proximity head 106, in one embodiment, moves while in close proximity to a top surface 108a of the wafer 108 to conduct a wafer processing operation. It should be appreciated that the proximity head 106 may also be utilized to process (e.g., clean, dry, plate, etch, etc.) a bottom surface 108b of the wafer 108. In one embodiment, the wafer 108 is rotating so the proximity head 106 may be moved in a linear fashion along the head motion while the top surface 108a is being processed. By applying the IPA 310 through the inlet 302, the vacuum 312 through outlet 304, and the processing fluid 314 through the inlet 306, the meniscus 116 may be generated. It should be appreciated that the orientation of the inlets/outlets as shown in FIG. 3 is only exemplary in nature, and that any suitable inlets/outlets orientation that may produce a stable fluid meniscus may be utilized such as those configurations as described in the United States patent applications incorporated by reference previously.

Figure 4A:
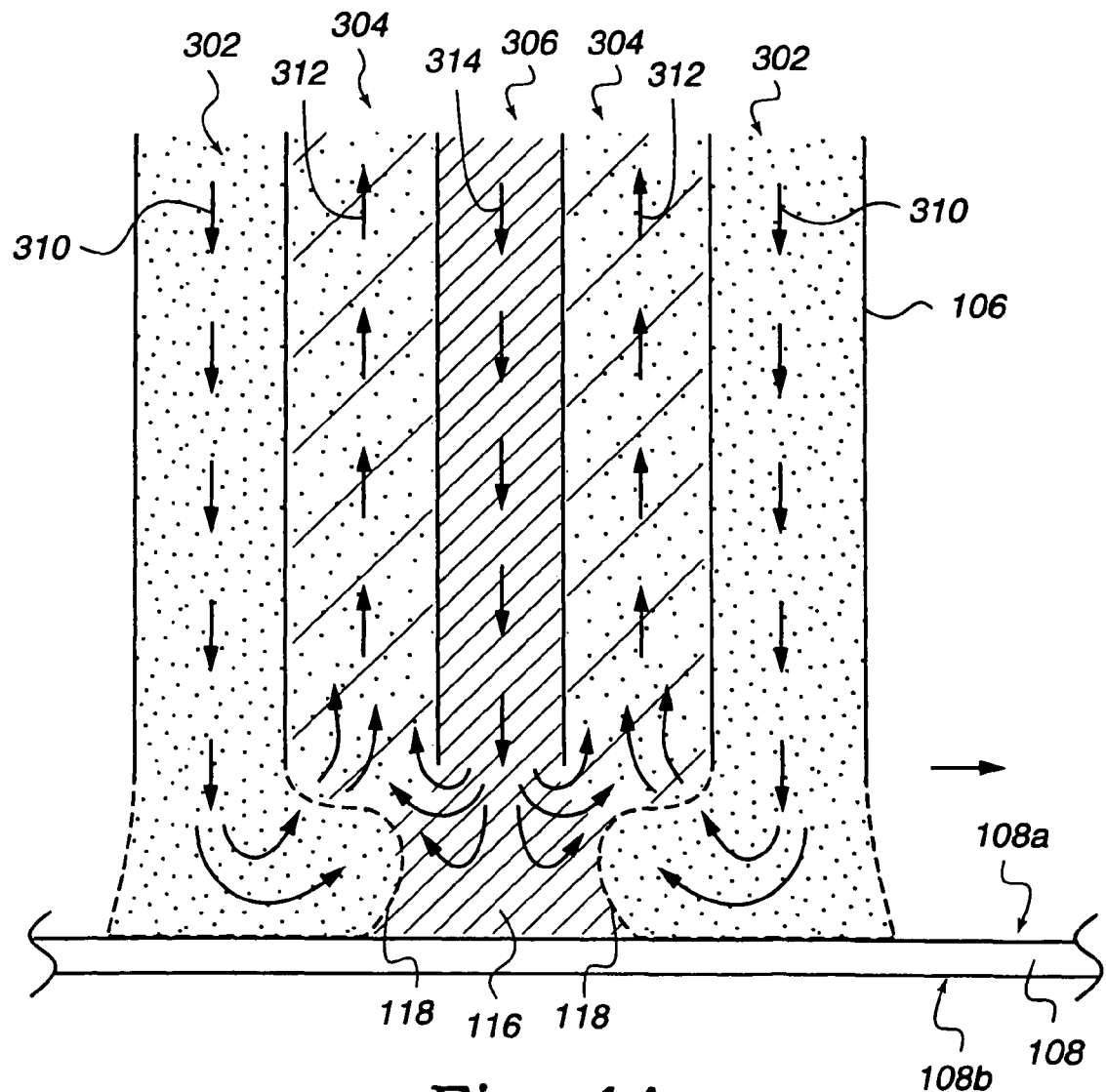
FIG. 4A illustrates a wafer processing operation that may be conducted by a proximity head in accordance with one embodiment of the present invention.

FIG. 4A illustrates a wafer processing operation that may be conducted by a proximity head 106a in accordance with one embodiment of the present invention. Although FIG. 4A shows a top surface 108a being processed, it should be appreciated that the wafer processing may be accomplished in substantially the same way for the bottom surface 108b of the wafer 108. In one embodiment, the inlet 302 may be utilized to apply isopropyl alcohol (IPA) vapor toward a top surface 108a of the wafer 108, and the inlet 306 may be utilized to apply a processing fluid toward the top surface 108a of the wafer 108. In addition, the outlet 304 may be utilized to apply vacuum to a region in close proximity to the wafer surface to remove fluid or vapor that may located on or near the top surface 108a. As described above, it should be appreciated that any suitable combination of inlets and outlets may be utilized as long as the meniscus 116 may be formed. The IPA may be in any suitable form such as, for example, IPA vapor where IPA in vapor form is inputted through use of a $N_2$ gas. Moreover, any suitable fluid used for processing the wafer (e.g., cleaning fluid, drying fluid, etching fluid, plating fluid, etc.) may be utilized that may enable or enhance the wafer processing. In one embodiment, an EPA inflow 310 is provided through the inlet 302, a vacuum 312 may be applied through the outlet 304 and processing fluid inflow 314 may be provided through the inlet 306. Consequently, if a fluid film resides on the wafer 108, a first fluid pressure may be applied to the wafer surface by the IPA inflow 310, a second fluid pressure may be applied to the wafer surface by the processing fluid inflow 314, and a third fluid pressure may be applied by the vacuum 312 to remove the processing fluid, IPA and the fluid film on the wafer surface.

Therefore, in one embodiment of a wafer processing, as the processing fluid inflow 314 and the IPA inflow 310 is applied toward a wafer surface, fluid (if any) on the wafer surface is intermixed with the processing inflow 314. At this time, the processing fluid inflow 314 that is applied toward the wafer surface encounters the IPA inflow 310. The IPA forms an interface 118 (also known as an IPA/processing fluid interface 118) with the processing fluid inflow 314 and along with the vacuum 312 assists in the removal of the processing fluid inflow 314 along with any other fluid from the surface of the wafer 108. In one embodiment, the IPA/processing fluid interface 118 reduces the surface of tension of the processing fluid. In operation, the processing fluid is applied toward the wafer surface and almost immediately removed along with fluid on the wafer surface by the vacuum applied by the outlet 304. The processing that is applied toward the wafer surface and for a moment resides in the region between a proximity head and the wafer surface along with any fluid on the wafer surface forms a meniscus 116 where the borders of the meniscus 116 are the IPA/processing fluid interfaces 118. Therefore, the meniscus 116 is a constant flow of fluid being applied toward the surface and being removed at substantially the same time with any fluid on the wafer surface. The nearly immediate removal of the processing fluid from the wafer surface prevents the formation of fluid droplets on the region of the wafer surface being dried thereby reducing the possibility of contamination on the wafer 108 after the processing fluid has accomplished its purpose depending on the operation (e.g., etching, cleaning, drying, plating, etc.). The pressure (which is caused by the flow rate of the IPA) of the downward injection of IPA also helps contain the meniscus 116. It should be understood that the in some configurations, IPA or surface tension reducing fluids is only optionally applied and embodiments without IPA application may be utilized.

In one embodiment, the flow rate of the N2 carrier gas containing the IPA may assist in causing a shift or a push of processing fluid flow out of the region between the proximity head and the wafer surface and into the outlets 304 (vacuum outlets) through which the fluids may be outputted from the proximity head. It is noted that the push of processing fluid flow is not a process requirement but can be used to optimize meniscus boundary control. Therefore, as the IPA and the processing fluid are pulled into the outlets 304, the boundary making up the IPA/processing fluid interface 118 is not a continuous boundary because gas (e.g., air) is being pulled into the outlets 304 along with the fluids. In one embodiment, as the vacuum from the outlets 304 pulls the processing fluid, IPA, and the fluid on the wafer surface, the flow into the outlets 304 is discontinuous. This flow discontinuity is analogous to fluid and gas being pulled up through a straw when a vacuum is exerted on combination of fluid and gas. Consequently, as the proximity head 106a moves, the meniscus moves along with the proximity head, and the region previously occupied by the meniscus has been dried due to the movement of the IPA/processing fluid interface 118. It should also be understood that the any suitable number of inlets 302 (optional), outlets 304 and inlets 306 may be utilized depending on the configuration of the apparatus and the meniscus size and shape desired. In another embodiment, the liquid flow rates and the vacuum flow rates are such that the total liquid flow into the vacuum outlet is continuous, so no gas flows into the vacuum outlet.

It should be appreciated any suitable flow rate may be utilized for the $N_2$/IPA, processing fluid, and vacuum as long as the meniscus 116 can be maintained. In one embodiment, the flow rate of the processing fluid through a set of the inlets 306 is between about 25 ml per minute to about 3,000 ml per minute. In a preferable embodiment, the flow rate of the processing fluid through the set of the inlets 306 is about 800 ml per minute. It should be understood that the flow rate of fluids may vary depending on the size of the proximity head. In one embodiment a larger head may have a greater rate of fluid flow than smaller proximity heads. This may occur because larger proximity heads, in one embodiment, have more inlets 302 and 306 and outlets 304.

In one embodiment, the flow rate of the $N_2$/IPA vapor through a set of the inlets 302 is between about 1 liter per minute (SLPM) to about 100 SLPM. In a preferable embodiment, the IPA flow rate is between about 6 and 20 SLPM.

In one embodiment, the flow rate for the vacuum through a set of the outlets 304 is between about 10 standard cubic feet per hour (SCFH) to about 1250 SCFH. In a preferable embodiment, the flow rate for a vacuum though the set of the outlets 304 is about 350 SCFH. In an exemplary embodiment, a flow meter may be utilized to measure the flow rate of the $N_2$/IPA, processing fluid, and the vacuum.

It should be appreciated that any suitable type of wafer processing operation may be conducted using the meniscus depending on the processing fluid utilized. For example, a cleaning fluid such as, for example, SC-1, SC-2, etc., may be used for the processing fluid to generate wafer cleaning operation. In a similar fashion, different fluids may be utilized and similar inlet and outlet configurations may be utilized so the wafer processing meniscus may also etch and/or plate the wafer. In one embodiment, etching fluids such as, for example, HF, EKC proprietary solution, KOH etc., may be utilized to etch the wafer. In another embodiment, plating fluids such as, for example, Cu Sulfate, Au Chloride, Ag Sulfate, etc. in conjunction with electrical input may be conducted.

FIG. 4B illustrates a side view of exemplary proximity heads 106a and 106b for use in a dual wafer surface processing system in accordance with one embodiment of the present invention. In this embodiment, by usage of inlets 302 and 306 to input $N_2$/IPA and processing respectively along with the outlet 304 to provide a vacuum, the meniscus 116 may be generated. In addition, on the side of the inlet 306 opposite that of the inlet 302, there may be a outlet 304 to remove processing fluid and to keep the meniscus 116 intact. As discussed above, in one embodiment, the inlets 302 and 306 may be utilized for IPA inflow 310 and processing fluid inflow 314 respectively while the outlet 304 may be utilized to apply vacuum 312. In addition, in yet more embodiments, the proximity heads 106a and 106b may be of a configuration as shown in the United States patent applications referenced above. Any suitable surface coming into contact with the meniscus 116 such as, for example, wafer surfaces 108a and 108b of the wafer 108 may be processed by the movement of the meniscus 116 into and away from the surface.

FIGS. 5A through 10 show exemplary proximity heads where a first fluid meniscus is at least partially surrounded by at least a second fluid meniscus. It should be appreciated that the first fluid meniscus and/or the second fluid meniscus may be generated to conduct any suitable type of substrate/wafer processing operation such as, for example, lithography, etching, plating, cleaning, and drying. The first fluid meniscus and the second fluid meniscus may be any suitable shape or size depending on the substrate processing operation desired. In certain embodiments described herein, the first fluid meniscus and the second fluid meniscus are concentric where the second fluid meniscus surrounds the first fluid meniscus and the first fluid meniscus and the second fluid meniscus provide a continuous fluid connection. Therefore, after the first fluid meniscus processes the substrate, the portion of the wafer processed by the first fluid meniscus is immediately processed by the second fluid meniscus without a substantial amount of the contact with the atmosphere. It should be appreciated that depending on the operation desired, in one embodiment, the first fluid meniscus may contact the second meniscus and in another embodiment, the first fluid meniscus does not directly contact the second meniscus.

Figure 5A:
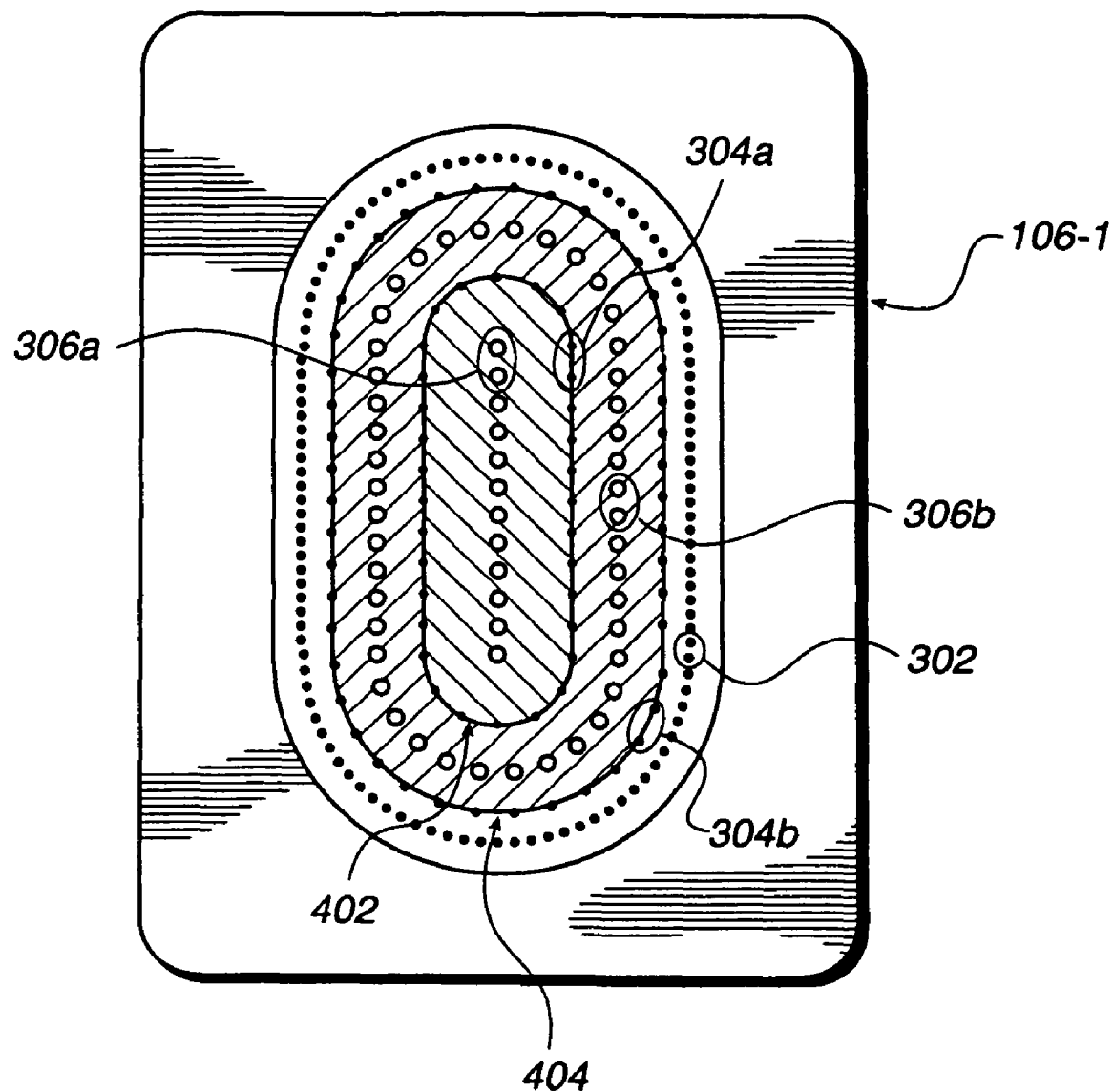
FIG. 5A shows a multi-menisci proximity head in accordance with one embodiment of the present invention.

FIG. 5A shows a multi-menisci proximity head 106-1 in accordance with one embodiment of the present invention. The multi-menisci proximity head 106-1 includes a plurality of source inlets 306a that can apply a first fluid to the wafer surface. The first fluid can then be removed from the wafer surface by application of vacuum through a plurality of source outlets 304a. Therefore, the first fluid meniscus may be generated by the conduits located within a first fluid meniscus region 402 of the processing surface on the multi-menisci proximity head 106-1.

The multi-menisci proximity head 106-1 may also include a plurality of source inlets 306b that can apply a second fluid to the wafer surface. The second fluid can then be removed from the wafer surface by application of vacuum through a plurality of source outlets 304b. In one embodiment, a portion of the second fluid is also removed by the plurality of source outlets 304a in conjunction with the removal of the first fluid. In one embodiment, the plurality of source outlets 304a may be called a one phase fluid removal conduit because the outlets 304a remove liquids applied to the wafer through the source inlets 306a and 306b. In addition, the plurality of source outlets 306b may be called a two phase removal conduit because the outlets 306b removes the second fluid from the source inlets 306b and the atmosphere outside of the fluid meniscus. Therefore, in one embodiment, the outlets 306b removes both liquid and gas while the outlets 306a remove only liquids. As a result, the second fluid meniscus may be created by the conduits located within a second fluid meniscus region 404 of the processing surface on the multi-menisci proximity head 106-1.

Optionally, the multi-menisci proximity head 106-1 may include a plurality of source inlets 302 which can apply a third fluid to the wafer surface. In one embodiment, the third fluid may be a surface tension reducing fluid that can reduce the surface tension of a liquid/atmosphere border of the second meniscus formed by that application of the second fluid to the wafer surface.

In addition, the processing surface (e.g., the surface area of the multi-menisci proximity head where the conduits exist) of the multi-menisci proximity head 106-1 (or any other proximity head discussed herein) may be of any suitable topography such as, for example, flat, raised, lowered. In one embodiment, the processing surface of the multi-menisci 106-1 may have a substantially flat surface.

FIG. 5B shows a cross section view of the multi-menisci proximity head 106-1 in accordance with one embodiment of the present invention. The multi-menisci proximity head 106-1 can apply the first fluid through the plurality of source inlets 306a and remove the first fluid through the plurality of source outlets 304a. The first fluid meniscus 116a is located underneath a region substantially surrounded by the plurality of source outlets 304a. The multi-menisci proximity head 106-1 can also apply the second fluid through the plurality of source inlets 306b and remove the second fluid through the plurality of source outlets 304a on one side of the second fluid meniscus and 304b on the other side. In one embodiment, the plurality of source inlets 302 may apply the third fluid to decrease the surface tension of the fluid making up the second fluid meniscus 116b. The plurality of source inlets 302 may be optionally angled to better confine the second fluid meniscus 116b.

Figure 6A:
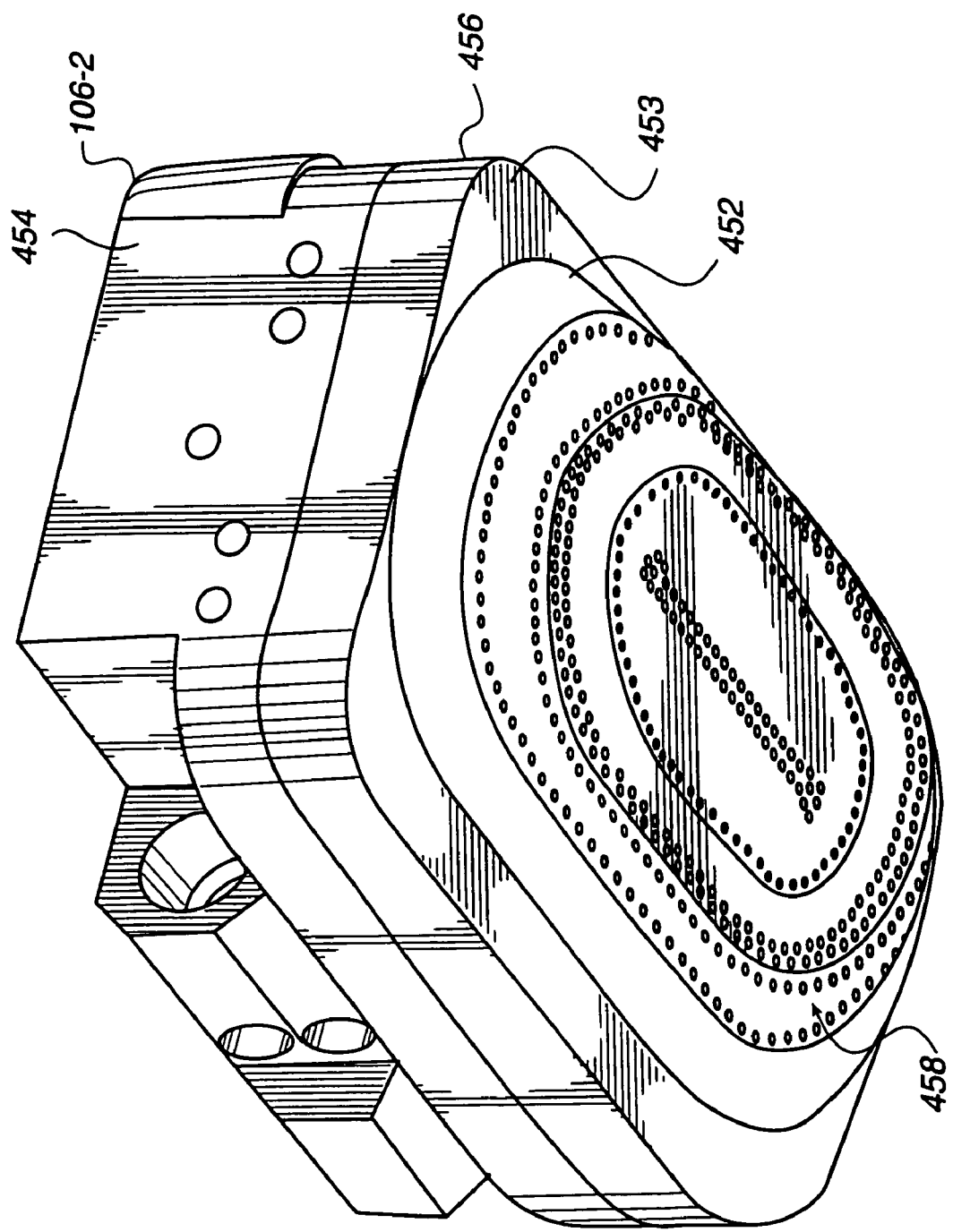
FIG. 6A illustrates a multi-menisci proximity head in accordance with one embodiment of the present invention.

FIG. 6A illustrates a multi-menisci proximity head 106-2 in accordance with one embodiment of the present invention. The proximity head 106-2 includes, in one embodiment, a facilities plate 454 and a body 458. It should be appreciated the proximity head 106-2 may include any suitable numbers and/or types of pieces as long as the first fluid meniscus and the second fluid meniscus as described herein may be generated. In one embodiment, the facilities plate 454 and the body 458 may be bolted together or in another embodiment, the plate 454 and the body 458 may be attached by an adhesive. The facilities plate 454 and the body 458 may be made from the same material or different materials depending on the applications and operations desired by a user.

The proximity head 106-2 may include a processing surface 458 which includes conduits where fluid(s) may be applied to surface of the wafer and the fluid(s) maybe removed from a surface of the wafer. The processing surface 458 may, in one embodiment, be elevated above a surface 453 as shown by an elevated region 452. It should be appreciated that the processing surface 458 does not have to be elevated and that the surface 458 may be substantially planar with the surface 453 of the proximity head 106-2 that faces the surface of the wafer being processed.

Figure 6B:
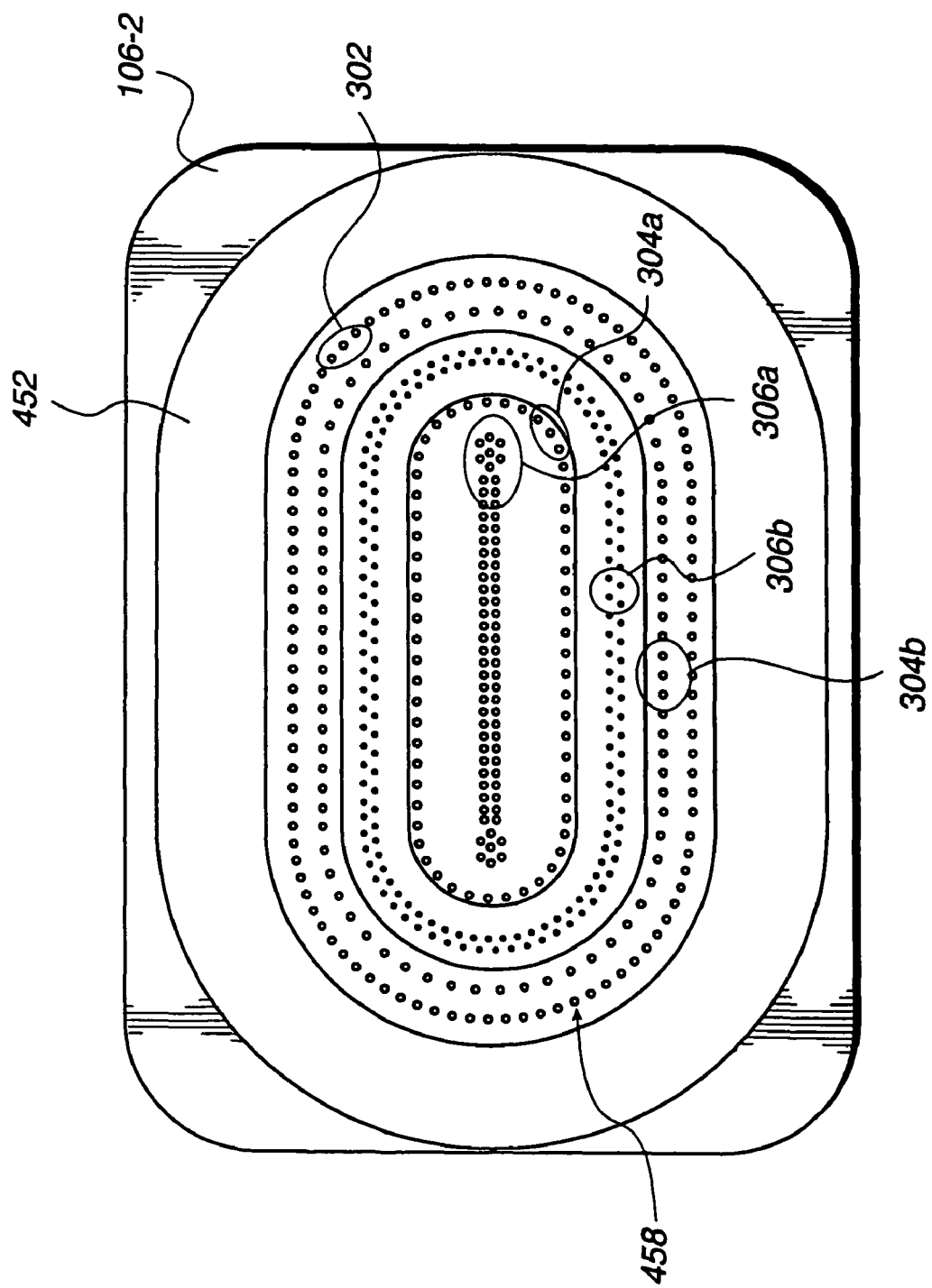
FIG. 6B illustrates the processing surface of the proximity head in accordance with one embodiment of the present invention.

FIG. 6B illustrates the processing surface 458 of the proximity head 106-2 in accordance with one embodiment of the present invention. In one embodiment, the processing surface 458 is a region of the proximity head 106-2 which generates the fluid menisci. The processing surface 458 may include any suitable number and type of conduits so the first fluid meniscus and the second fluid meniscus may be generated. In one embodiment, the processing surface 458 includes fluid inlets 306a, fluid outlets 304a, fluid inlets 306b, fluid outlets 304b, and fluid inlets 302.

The fluid inlets 306a may apply a first fluid to the surface of the wafer, and the fluid inlets 306b may apply a second fluid to the surface of the wafer. In addition, the fluid outlets 304a may remove the first fluid and a portion of a second fluid from the surface of the wafer by the application of vacuum, and the fluid outlets 304b may remove a portion of the second fluid from the surface of the wafer by the application of vacuum, and the fluid inlets 302 may apply a fluid that can decrease the surface tension of the second fluid. The first fluid and/or the second fluid may be any suitable fluid that can facilitate any one of a lithography operation, an etching operation, a plating operation, a cleaning operation, a rinsing operation, and a drying operation.

Figure 6C:
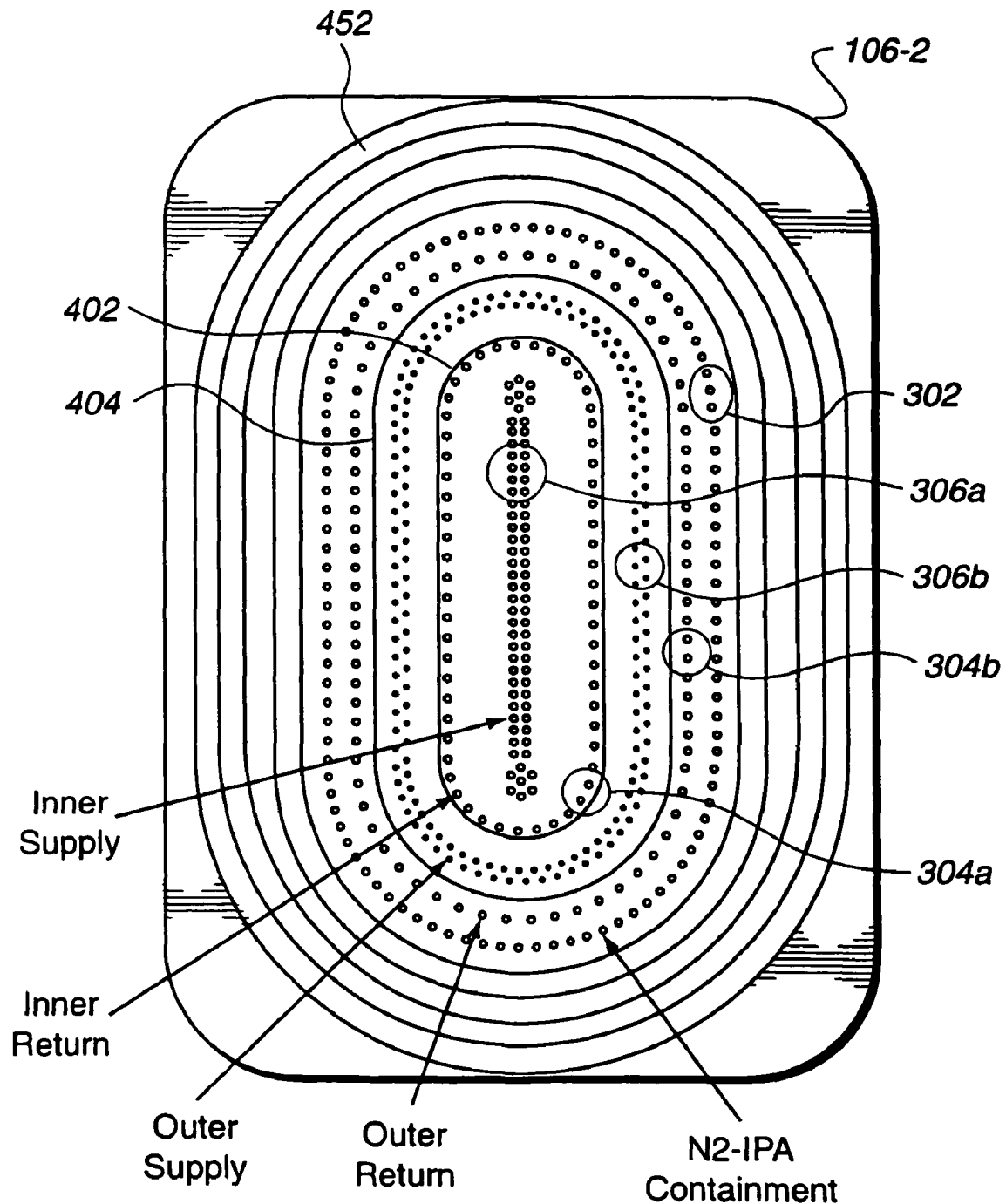
FIG. 6C shows a closer view of the processing surface of the multi-meniscus proximity head in accordance with one embodiment of the present invention.

FIG. 6C shows a closer view of the processing surface 458 of the multi-meniscus proximity head 106-2 in accordance with one embodiment of the present invention. In one embodiment, the processing surface 458 includes a first fluid meniscus region 402 which includes the fluid inlets 306a and fluid outlets 304a. The processing surface 458 also includes a second fluid meniscus region 404 includes the fluid inlets 306b and the fluid outlets 304b and the fluid inlets 302. Therefore, the first fluid meniscus region 402 can generate the first fluid meniscus and the second fluid meniscus region 404 can generate the second fluid meniscus.

Figure 6D:
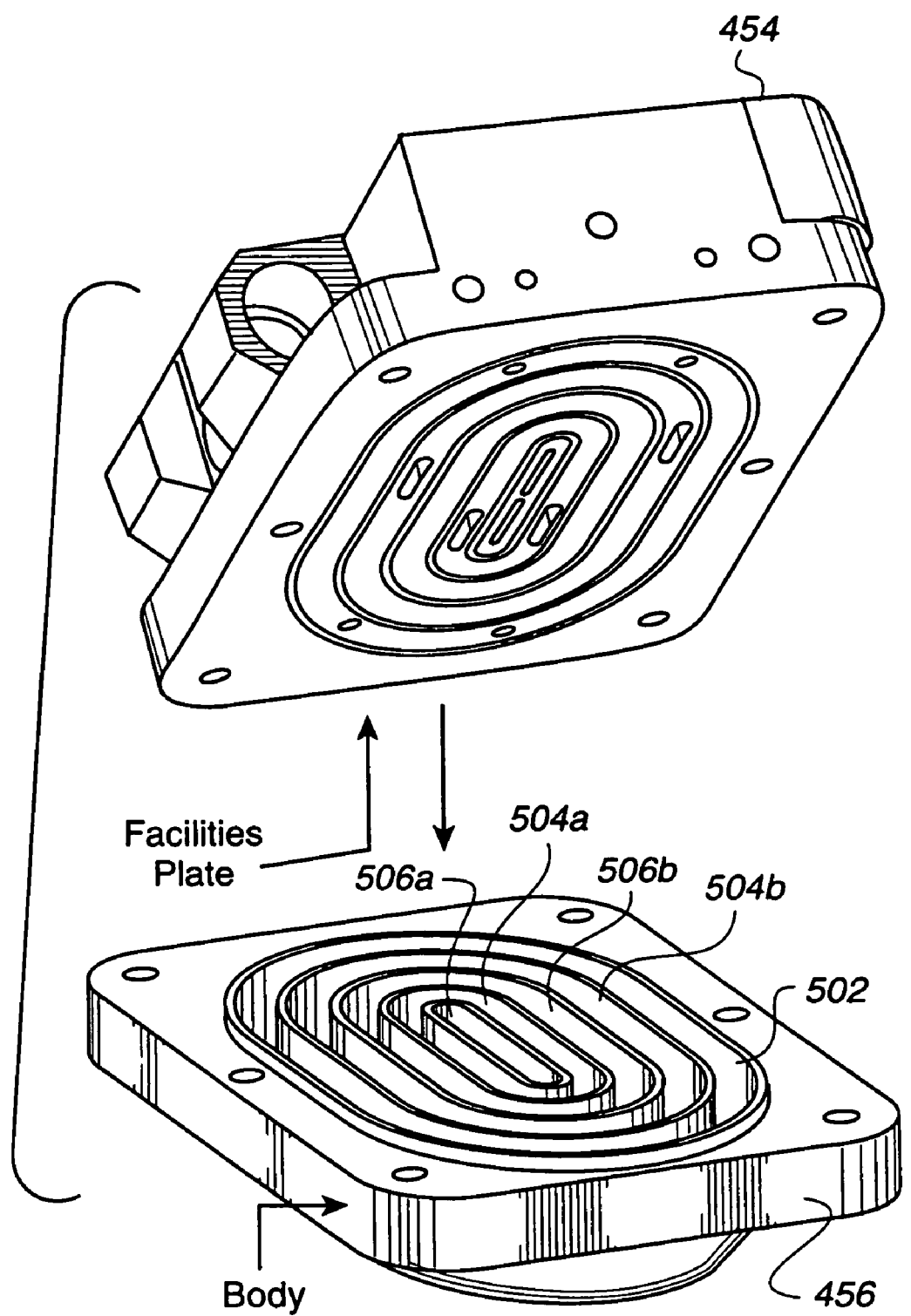
FIG. 6D shows the facilities plate attaching to the body to form the multi-menisci proximity head in accordance with one embodiment of the present invention.

FIG. 6D shows the facilities plate 454 attaching to the body 456 to form the multi-menisci proximity head 106-2 in accordance with one embodiment of the present invention. Channels corresponding to the fluid inlets 306a, 304a, and 302 supply fluid from the facilities plate 454 into the body 456 of the multi-menisci proximity head 106-2, and channels corresponding to the fluid outlets 306b and 304b remove fluid from the body 456 to the facilities plate 454. In one embodiment channels 506a, 504a, 506b, 504b, and 502 correspond to the fluid inlets 306a, fluid outlets 306b, fluid inlets 304a, fluid outlets 304b, and fluid inlets 302.

Figure 6E:
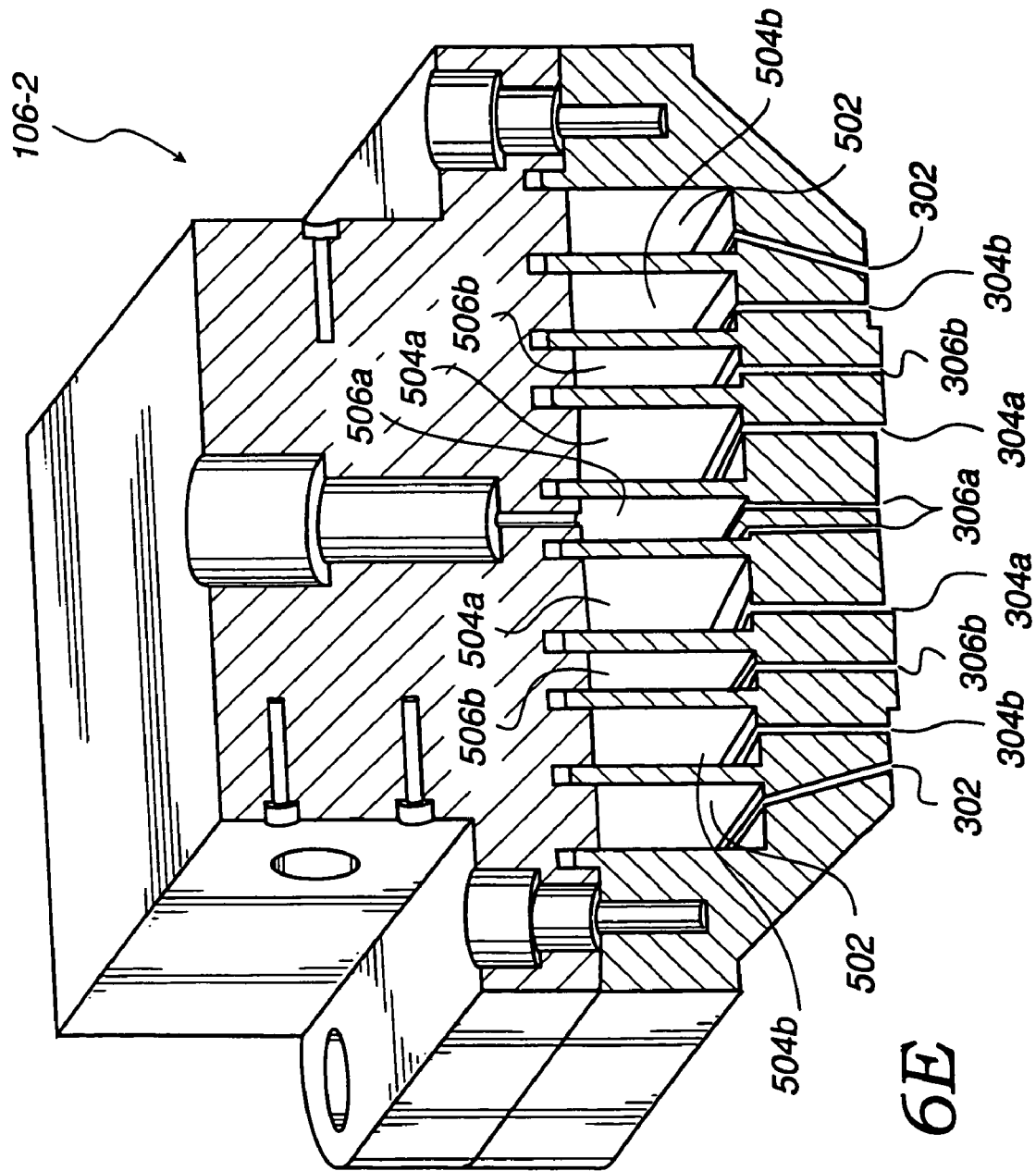
FIG. 6E illustrates a cross section view of the proximity head in accordance with one embodiment of the present invention.

FIG. 6E illustrates a cross section view of the proximity head 106-2 in accordance with one embodiment of the present invention. As described in reference to FIG. 6D, channels 506a, 506b, and 502 may supply a first fluid, a second fluid, and a third fluid to fluid inlets 306a, 306b, and 302 respectively. In addition, a channel 504a may remove a combination of the first fluid and the second fluid from the fluid outlets 304a, and channel 504b may remove combination of the second fluid and the third fluid from the outlets 304b. In one embodiment, the first fluid is a first processing fluid that can conduct any suitable operation on a wafer surface such as, for example, etching, lithography, cleaning, rinsing, and drying. The second fluid is a second processing fluid that may or may not be the same as the first fluid. As with the first fluid, the second fluid may be any suitable type of processing fluid such as, for example, a fluid that can facilitate etching, lithography, cleaning, rinsing, and drying.

Figure 7:
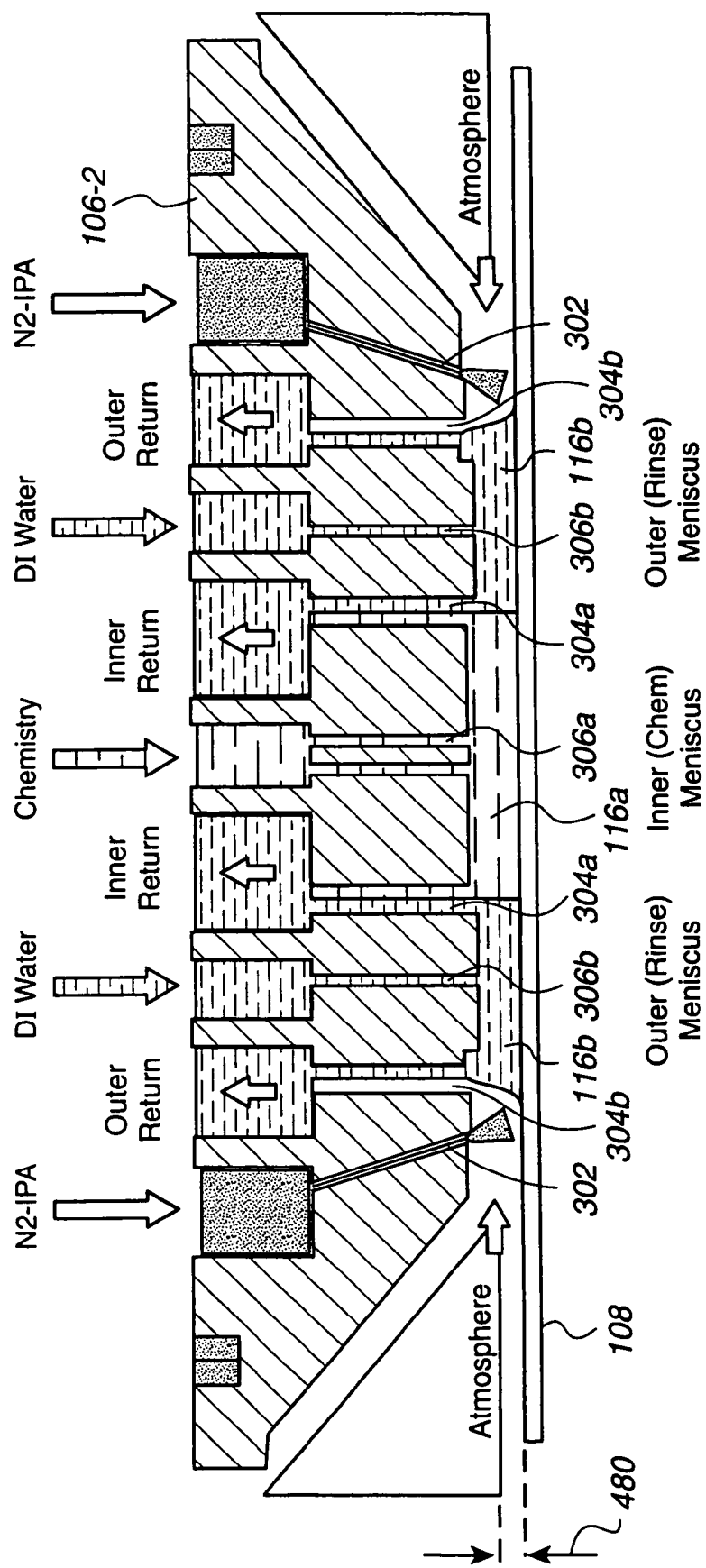
FIG. 7 illustrates a cross-sectional view of the multi-menisci proximity head in exemplary wafer processing operations in accordance with one embodiment of the present invention.

FIG. 7 illustrates a cross-sectional view of the multi-menisci proximity head in exemplary wafer processing operations in accordance with one embodiment of the present invention. Although FIG. 7 shows a top surface of the wafer 108 being processed, it should be appreciated by those skilled in the art that both a top surface and a bottom surface of the wafer 108 may be concurrently processed by any of the proximity heads described herein on the top surface of the wafer 108 and by any of the proximity heads described herein on the bottom surface of the wafer 108. In one embodiment, a first wafer processing chemistry is applied to the wafer 108 through fluid inlet 306a. After the first wafer processing chemistry has processed the wafer surface, the first wafer processing chemistry is removed from the wafer surface through the fluid outlet 304a. The first wafer processing fluid may form a first fluid meniscus 116a between the multi-menisci proximity head 106-2 and the wafer 108. In one embodiment, a second processing fluid such as, for example, deionized water (DIW) is applied to the wafer surface through the fluid inlets 306b.

As discussed above, the second processing fluid may be any suitable fluid that can accomplish the desired operation on the wafer surface. After the DIW has processed the wafer surface, the DIW is removed from the wafer surface through both the source outlets 304a and 304b. The DIW between the multi-menisci proximity head 106-2 and the wafer surface may form a second fluid meniscus 116b.

In one embodiment, a surface tension reducing fluid such as, for example, isopropyl alcohol vapor in nitrogen gas may optionally be applied from the source inlet 302 to the wafer surface to keep the liquid/gas border of the second fluid meniscus 116b stable. In one embodiment, the second fluid meniscus 116b can substantially surround the first fluid meniscus 116a. In this way, after the first fluid meniscus 116a has processed the wafer surface, the second fluid meniscus 116b can nearly immediately begin operating on a portion of the wafer surface already processed by the first fluid meniscus 116a. Therefore, in one embodiment, the second fluid meniscus 116b forms a concentric ring around the first fluid meniscus 116a. It should be appreciated that the first fluid meniscus 116a may be any suitable geometric shape such as, a circle, ellipse, square, rectangle, triangular, quadrilateral, etc. The second fluid meniscus 116b can be configured to at least partially surround whatever shape the first fluid meniscus 116a may be. It should be appreciated that, as discussed above, the first fluid meniscus 116a and/or the second fluid meniscus 116b may utilize any suitable fluid(s) depending on the wafer processing operation desired.

It should be appreciated that to generate a stable fluid meniscus, an amount of the first fluid inputted into the first fluid meniscus through the source inlets 306a should be substantially equal to the amount of the first fluid removed through the source outlets 304a. The amount of the second fluid inputted into the second fluid meniscus through the source inlets 306b should be substantially equal to the amount of the second fluid removed through the source outlets 304a and 304b. In one embodiment, the flow rate of the fluids are determined by a distance 480 the proximity head 106-2 is off of the wafer 108. It should be appreciated that the distance 480 may be any suitable distance as long as the menisci can be maintained and moved in a stable manner. In one embodiment, the distance 480 may be between 50 microns and 5 mm, and in another embodiment 0.5 mm to 2.5 mm. Preferably, the distance 480 is between about 1 mm and 1.5 mm. In one embodiment, the distance 480 is about 1.3.

The flow rates of the fluids as shown in FIG. 7 may be any suitable flow rate that can generate the first fluid meniscus and the second fluid meniscus that substantially surrounds the first meniscus. Depending on the distinction desired between the first fluid meniscus and the second fluid meniscus, the flow rates may differ. In one embodiment, source inlets 306a may apply the first fluid at a flow rate of about 600 cc/min, source inlets 306b may apply the second fluid at a flow rate of about 900 cc/min, a source outlets 304a may remove the first fluid and the second fluid at a flow rate of about 1200 cc/min, and the source outlets 304b may remove the second fluid and atmosphere (which may include some IPA vapor in $N_2$ if such a surface tension reducing fluid is being applied to the wafer surface) at a flow rate of about 300 cc/min. In one embodiment, the flow rate of fluids through the source outlets 304 may equal 2 times the flow rate of fluid through the source inlets 306a. The flow rate of fluid through the source inlets 306b may be equal to the flow rate through the source inlets 306a plus 300. It should be appreciated by those skilled in the art that specific flow rate relationships of the source inlets 306a, 306b and source inlets 304a, 304b may change depending on the configuration of the process area and/or the configuration of the proximity heads described herein.

Figure 8:
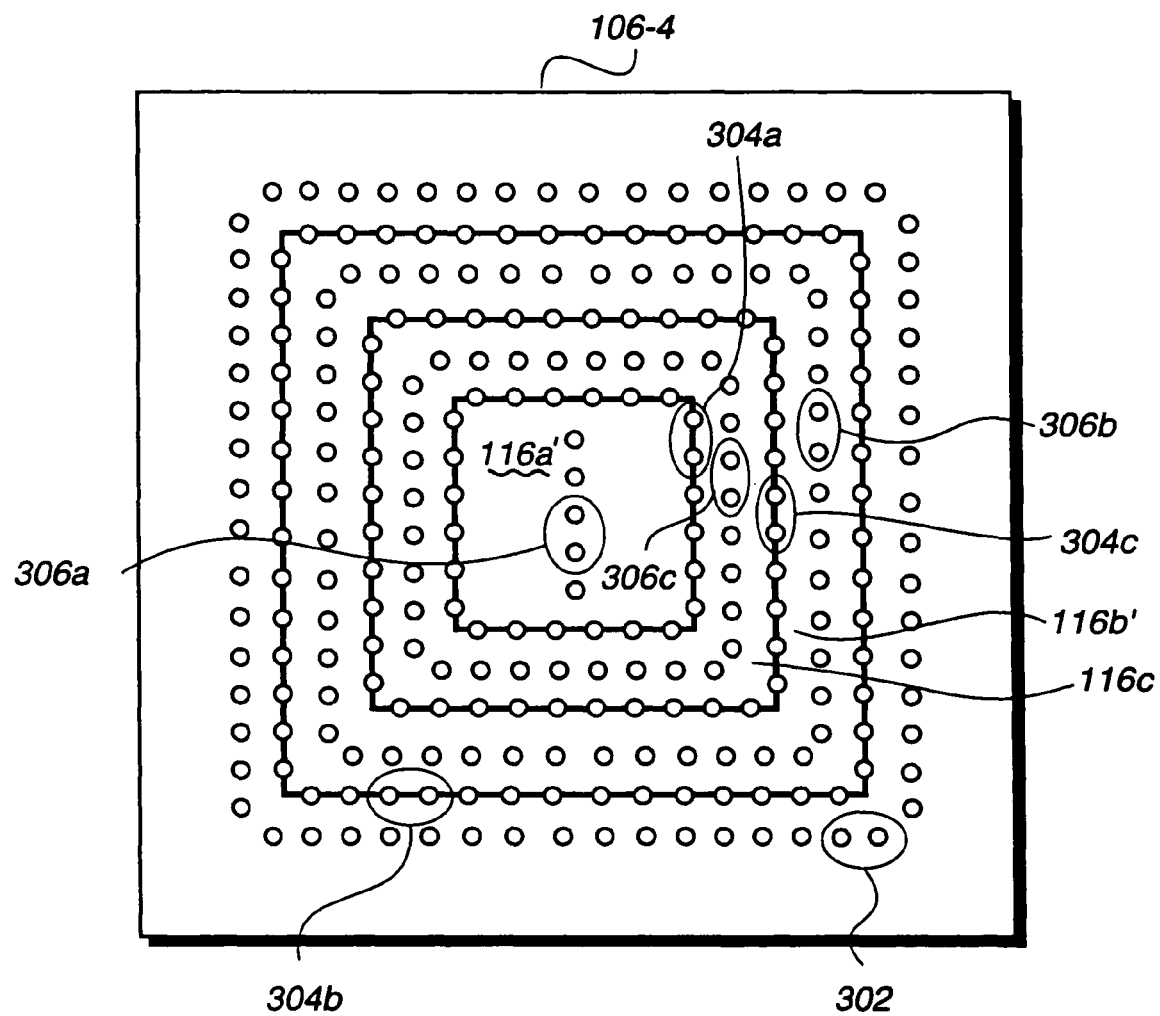
FIG. 8 illustrates a multi-menisci proximity head that includes rectangular shaped menisci in accordance with one embodiment of the present invention.

FIG. 8 illustrates a multi-menisci proximity head 106-4 that includes rectangular shaped menisci in accordance with one embodiment of the present invention. In this embodiment, the multi-menisci proximity head 106-4 includes a square shaped meniscus 116a' surrounded by a meniscus 116c which in turn is surrounded by the outside fluid meniscus 116b'. It should be appreciated by those skilled in the art that the menisci 116a', 116c, and 116b' may be generated by changing the inlet/outlet configurations as described herein. In one embodiment, the source inlets 306a, 306c, and 306b may be configured to apply a first fluid, a second fluid and a third fluid to the wafer. In addition, the source outlets 304a, 304c, and 304b may be configured to remove (by vacuum) the first fluid and the second fluid, the second fluid and the third fluid, and the third fluid and atmosphere respectively. In addition, source inlets 302 may optionally be utilized to apply a surface tension reducing fluid to an outside portion of the third fluid meniscus. It should be appreciated by those skilled in the art that each of the fluid menisci 116a', 116b', and 116c as described in reference to FIG. 8 may conduct any suitable operation on the wafer surface such as, for example, etching, cleaning, lithography, rinsing, drying etc.

Figure 9:
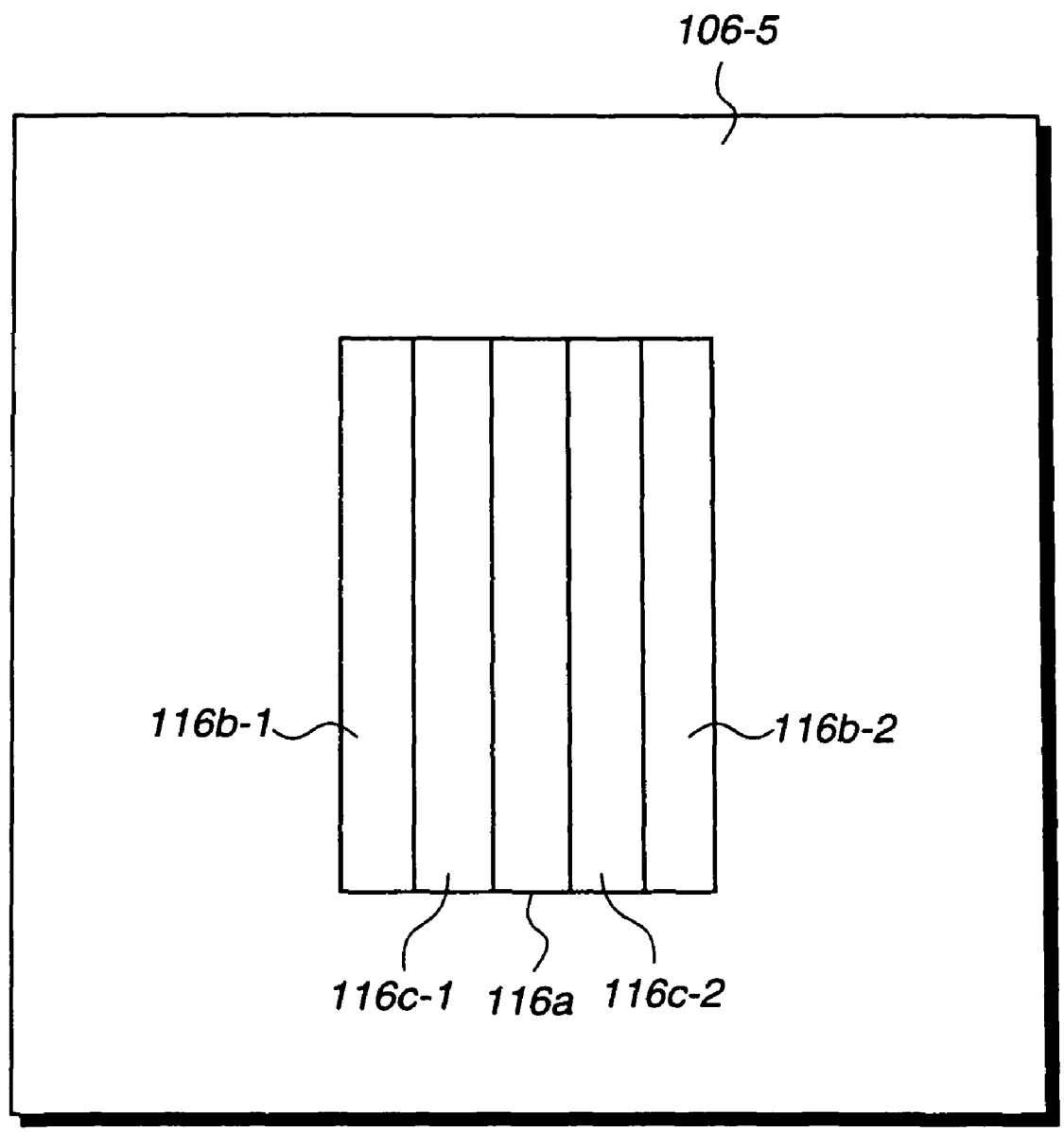
FIG. 9 shows a multi-menisci proximity head with oblong fluid menisci in accordance with one embodiment of the present invention.

FIG. 9 shows a multi-menisci proximity head 106-5 with oblong fluid menisci in accordance with one embodiment of the present invention. In one embodiment, the fluid meniscus 116a is surrounded on both sides (length wise in one embodiment) by fluid menisci 116c-1, 116c-2 which are in turn surrounded by fluid menisci 116b-1 and 116b-2. It should be appreciated that each of the fluid menisci shown in FIG. 9 may conduct any suitable operation on the wafer surface such as, for example, etching, cleaning, lithography, rinsing, drying etc. It should also be appreciated that the menisci shown may be generated in any suitable method consistent with the methodology and apparatuses described herein.

FIGS. 10 through 16 illustrate exemplary embodiments where the fluid inputs into the proximity heads may include flow control mechanisms that can vary the flow of fluid into the source inlets 306 defined in the proximity head and therefore may vary the flow of fluid from the source inlets to a region between the proximity head and the wafer. The flow of fluid through the fluid outputs connected to the source outlets 304 of the proximity heads may also be controlled by using flow control mechanisms that can vary the flow of fluid from the proximity head. It should be appreciated the flow control mechanism may be any suitable device that can vary flow of fluid. In one embodiment, the flow control mechanism may be valve that can be turned on or off. In another embodiment, the valve may be have any suitable number of settings that can vary flow rate from none to the maximum flow available through a certain size input. The flow control mechanism may be included with each one of the fluid inputs or a flow control mechanism may manage the flow of multiple fluid inputs.

In one embodiment, the vacuum applied through fluid outputs from the proximity head may also be varied through use of a flow control mechanism. Consequently, at least one of the source inlets and at least one of source inlets may have their fluid flows managed and controlled. In one embodiment, by varying the flow through each one of the source inlets/outlets the proximity head can be configured such that the fluid meniscus can be formed or removed in segments at a time, or segments may be progressively generated or removed until the desired shape or size is reached. This can be accomplished by adjusting the fluid flow of each source inlet/outlet corresponding to a particular meniscus segment. In another embodiment, both fluid input into the proximity head and the fluid output out of the proximity head may be managed in concert to control fluid meniscus segments. It should also be understood that the fluid flow control mechanism for the one or more of the fluid inputs/outputs may be located in a fluid supply or removal device, such as, for example, a fluid manifold. It should also be appreciated that the fluid flow control mechanism may be also be located within each one of the source inlets/outlets.

It should be appreciated that in the side views of the proximity heads 106 in the following figures, the source outlets 304 and the source inlets 302 are not shown to more clearly show that the fluid inputs are connected to the source inlets 306.

FIG. 10A illustrates a side view of a proximity head 106-6 with fluid inputs in accordance with one embodiment of the present invention. In one embodiment, each one of the plurality of source inlets 306 is connected to corresponding ones of a plurality of fluid inputs 402. It should be appreciated that fluid flow input from each one or multiple ones of the plurality of fluid inputs into the source inlets 306 can be controlled independently through use of a fluid flow control device 404. In one embodiment, as shown in FIG. 10A, each one of the plurality of fluid inputs can include a fluid flow control device 404. It should be appreciated that the fluid flow control device 404 may be any suitable device that can control fluid flow such as, for example, valve, pinch-off device, gate, plug, flow restrictor, butterfly valve, ball valve, etc. In one embodiment, the fluid flow control device 404 may be a valve that can be turned on or off or set to any suitable partial flow. Therefore, in one embodiment, by controlling the fluid flow through each one of the plurality of variable flow fluid inputs 402 into respective ones of the plurality of source inlets 306, the segments of fluid meniscus controlled by the corresponding ones of the source inlets 306 may be turned on or off.

It should also be understood that fluid output may also be utilized where the fluid outputs may remove fluid from corresponding ones of the plurality of source outlets 304. In addition, a fluid flow control mechanism may also control the fluid flow through the fluid outputs thereby controlling fluid removed from the meniscus through the corresponding source outlets to which the fluid outputs are connected.

In one embodiment, when a segment of the fluid meniscus is desired to be generated, the fluid flow control device may be opened and set so the flow rate through the source inlets 306 is between 35 to 55 milliliter per minute per inlet. The source inlets 304 may be spaced between about 0.125 inch to about 0.5 inch from the source outlets 306. In addition, the source inlets 302 (if utilized) can be between about 0.625 inch to about 0.125 inch from the source inlets 306. These parameters may be utilized for any suitable proximity head 106 described herein. It should be appreciated that the process variables described above may be suitably varied depending on the wafer processing conditions and/or operations desired.

FIG. 10B shows a face view of a processing region of the proximity head 106-6 in accordance with one embodiment of the present invention. The processing region is the portion of the proximity head 106-6 where, in operation, the conduits of the proximity head 106-6 generate a fluid meniscus on a wafer surface. The processing region of the proximity head 106-6 may include a plurality of conduits which may be the source inlets 302 and 306 and the source outlets 304. In one embodiment, processing region includes regions 440, 442, and 444. A region where the plurality of source inlets 306 is located is shown by region 444. The plurality of source inlets 306 may be surrounded by region 442 which includes the plurality of source outlets 304. The plurality of source outlets 304 may be partially surrounded by or adjacent to a region 440 which may include the plurality of source outlets 302. As discussed above, the plurality of source inlets 306 may apply the processing fluid to the region between the face of the proximity head 106-6 and the wafer 108. The plurality of source outlets 304 may remove a portion of the fluid making up the meniscus from the region between the face of the proximity head 106-6 and the wafer 108. In one embodiment, each one of the plurality of source inlets 306 may receive fluid from respective ones of the plurality of fluid inputs 402. It should be appreciated that the conduit pattern illustrated in FIG. 10B is only exemplary in nature and that any suitable conduit pattern that can generate a fluid meniscus may be utilized with the fluid inputs 402 as long as one or multiple ones of the conduits may have individually controlled fluid flow controlled by the fluid flow control mechanism.

Figure 10C:
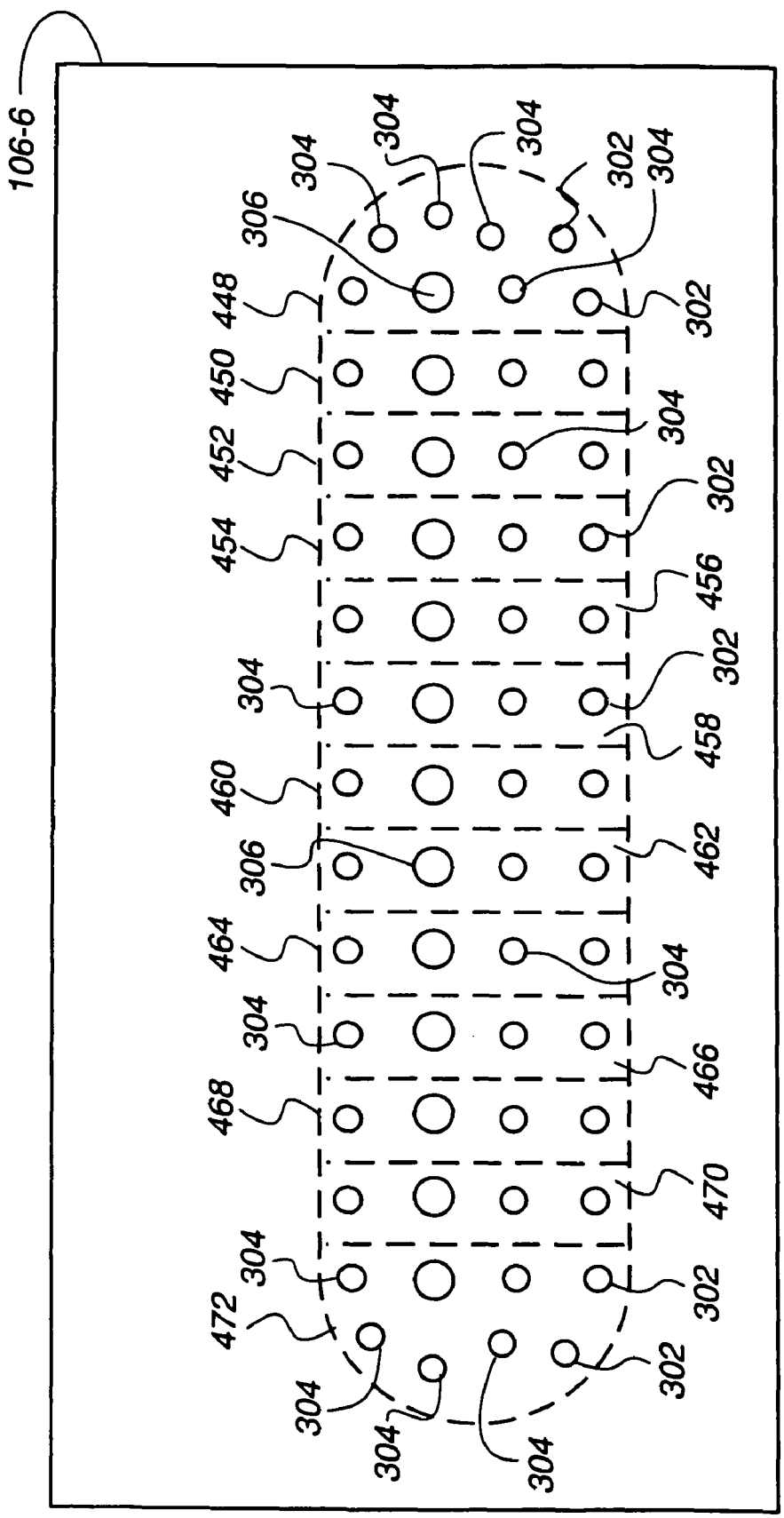
FIG. 10C illustrates the proximity head showing regions with the conduits that form segments of the meniscus formed by the proximity head during operation in accordance with one embodiment of the present invention.

FIG. 10C illustrates the proximity head 106-6 showing regions 448, 450, 452, 454, 456, 458, 460, 462, 464, 466, 468, 470, and 472 with the conduits that form segments of the meniscus formed by the proximity head 106-6 during operation in accordance with one embodiment of the present invention. In one embodiment, each of the source inlet 306, the source outlets 304, and the source inlets 302 within each of the regions 448, 450, 452, 454, 456, 458, 460, 462, 464, 466, 468, 470, and 472 may be separately managed. In this way fluid flow into and out of each of the regions 448, 450, 452, 454, 456, 458, 460, 462, 464, 466, 468, 470, and 472 can be individually turned on or off thereby generating or removing the segment of the fluid meniscus corresponding to the regions 448, 450, 452, 454, 456, 458, 460, 462, 464, 466, 468, 470, and 472. It should also be appreciated that the segment of the fluid meniscus may be generated by a group of inlets (more than one) and groups of outlets (more than one). In addition, the groups of inlets may have corresponding fluid inputs, and the groups of outlets may have corresponding fluid outputs.

Figure 10D:
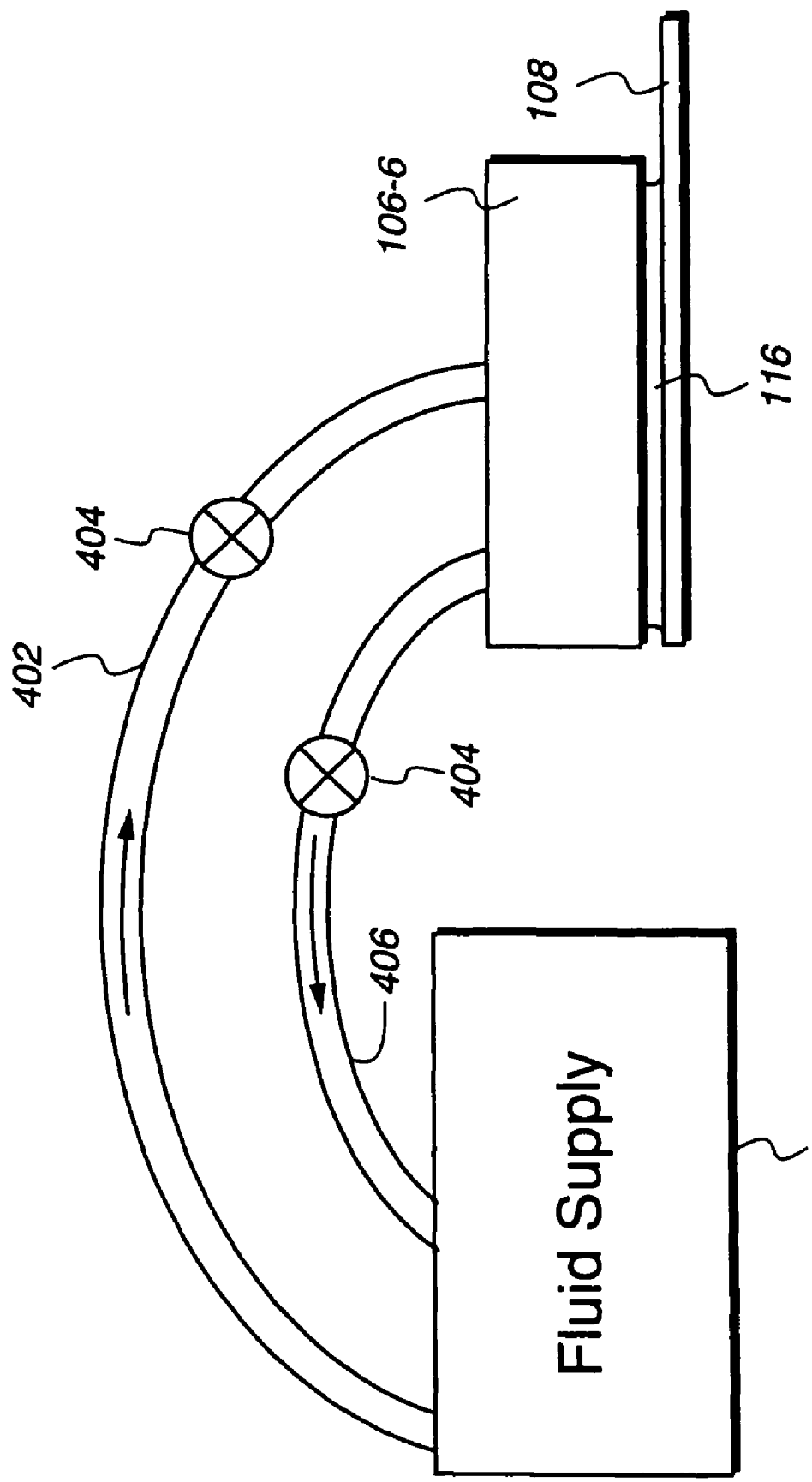
FIG. 10D shows a macroscopic view of a wafer processing system in accordance with one embodiment of the present invention.

FIG. 10D shows a macroscopic view of a wafer processing system in accordance with one embodiment of the present invention. In one embodiment, the system includes a proximity head 106-6 that may process the wafer 108 by application of the fluid meniscus 116. The proximity head 106-6 may include source inlets for applying a fluid making of the fluid meniscus 116 and source outlets for removing the fluid from the fluid meniscus 116. The proximity head 106-6 may be attached to a plurality of fluid inputs 402 and a plurality of fluid outputs 406. Each one of the plurality of fluid inputs 402 may have a fluid flow control device 404 and each one of the plurality of fluid outputs 406 may have a fluid flow control device 404. Each one of the plurality of fluid inputs 402 is connected to corresponding ones of the source inlets and each one of the plurality of fluid outputs 406 is connected to the corresponding ones of the source outlets. By allowing fluid flow or stopping fluid flow through the plurality of fluid inputs 402 and the plurality of fluid outputs 406 respectively, the fluid flow control devices 404 can manage the generation or removal of a segment of the fluid meniscus 116. In one embodiment, when a segment of the fluid meniscus 116 is to be generated, the fluid input corresponding to the source inlet supplying fluid to the segment of the fluid meniscus 116 is opened to fluid flow by the fluid flow control device 404 for that particular fluid input. At substantially the same time, the fluid input corresponding to the source outlet removing fluid from the segment of the fluid meniscus 116 is opened to fluid flow by the fluid flow control device 404 for that particular fluid output. Therefore through independent management of fluid flow through each of the fluid inputs and fluid outputs, segments of the fluid meniscus 114 may be generated and removed.

The system may also include a fluid supply 422 which may be coupled to the fluid inputs 402 and the fluid outputs 406. The fluid supply 422 may be any suitable device that can supply fluid to the fluid inputs 402 and remove fluid from the fluid outputs 406. In one embodiment, the fluid supply 422 may be a manifold that can manage fluid flow into each one of the inputs 402 and manage flow out of each one of the outputs 406. In another embodiment, the fluid supply 422 may control the flow rate and the fluid flow control mechanisms may located inside of the fluid supply 422.

Figure 11A:
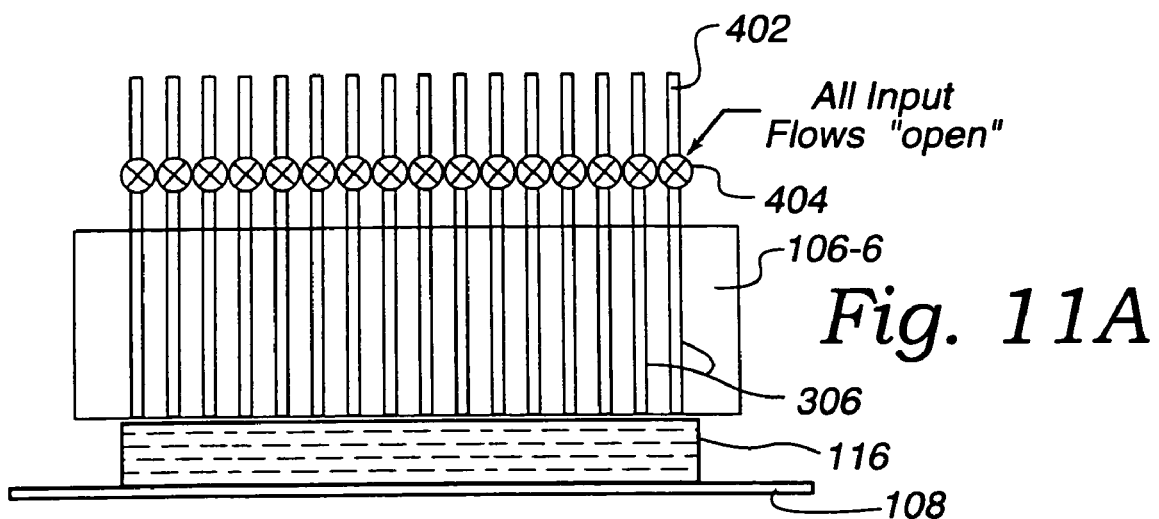
FIG. 11A shows a proximity head being supplied with fluid from the plurality of fluid inputs in accordance with one embodiment of the present invention.

FIG. 11A shows a proximity head 106 being supplied with fluid from the plurality of fluid inputs 402 in accordance with one embodiment of the present invention. In one embodiment, the proximity head is connected to the plurality of fluid inputs 402 such that segments of the meniscus 116 may be generated or removed depending on the number of meniscus(es) and/or shape of meniscus(es) desired. Segments of the meniscus 116 may be individual portions of the meniscus 116 that is formed by a particular one or ones of the plurality of source inlets 306. In addition, each of the segments of the meniscus 116 may also be managed by a particular one or ones of the plurality of source outlets 304. In one embodiment, fluid flows in certain ones of the plurality of source inlets 306 and certain ones of the plurality of source outlets 304 may be associated so when one source inlet 306 stops applying fluid to the wafer surface, a corresponding source outlet 304 stops removing fluid from the wafer surface. In the exemplary fluid meniscus generation operation shown in FIG. 11A, all of the plurality of fluid flow control devices 404 are turned on and therefore all of the plurality of source inlets 306 are supplied with fluid. Consequently, the maximum size fluid meniscus that can be generated by the embodiment of the proximity head 106 shown in FIG. 11A is portrayed as being formed on the wafer 108.

Figure 1B:
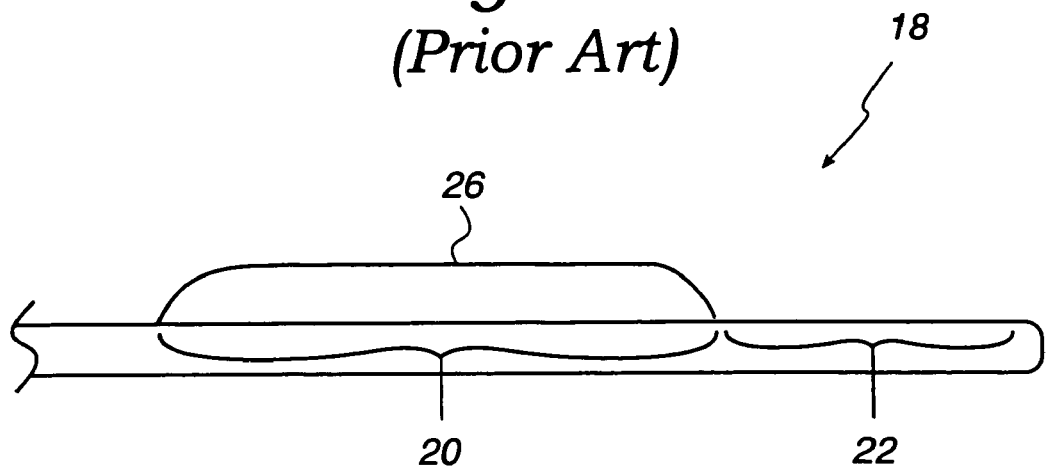
FIG. 1B illustrates an exemplary wafer drying process.
Figure 11B:
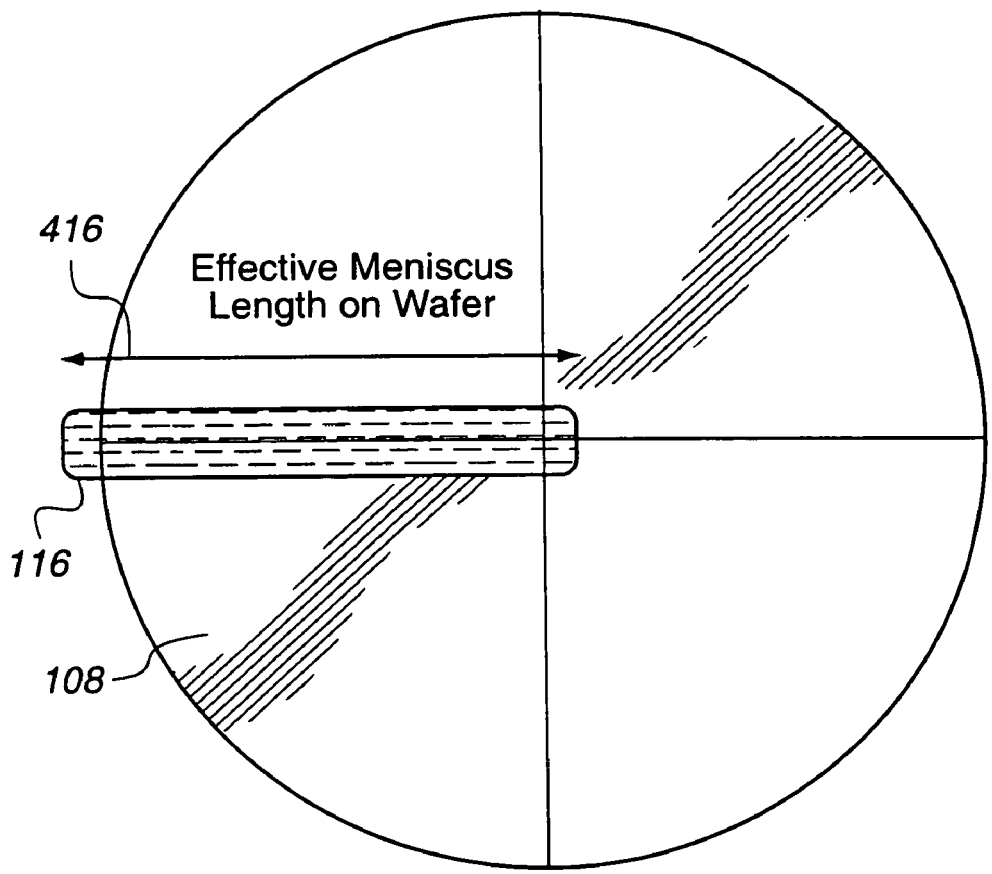
FIG. 11B shows a fluid meniscus that has been formed on the wafer by the proximity head of FIG. 11A in accordance with one embodiment of the present invention.

FIG. 11B shows a fluid meniscus 116 that has been formed on the wafer 108 by the proximity head 106-6 of FIG. 11A in accordance with one embodiment of the present invention. It should be appreciated that the size and/or shape of the meniscus can be determined in any suitable number of ways. In one embodiment, the meniscus 116 may extend beyond a radius of the wafer 108. By turning on or off certain fluid inputs supplying corresponding source inlets 306, certain segments of the meniscus 116 may be generated or removed. Therefore, in one embodiment, without moving the proximity head 106-6, the fluid meniscus 116 may be shortened or extended as shown by the bidirectional arrow 416 depending on which of the source inlets is supplied with fluid (and also depending on which of the source outlets is supplied with vacuum to remove fluid). When the fluid meniscus 116 extends slight beyond the radius of the wafer 108 as shown in FIG. 1B, the wafer 108 may be scanned under the proximity head. In another embodiment, the proximity head may form the meniscus 116 on the wafer surface and scan the fluid meniscus 116 over the wafer. In yet another embodiment, the proximity head 106 may cover a region larger than the wafer in which by using selected meniscus generation in different parts of the wafer, all of the wafer surface may be processed without movement of the proximity head 106 or the wafer.

Figure 11C:
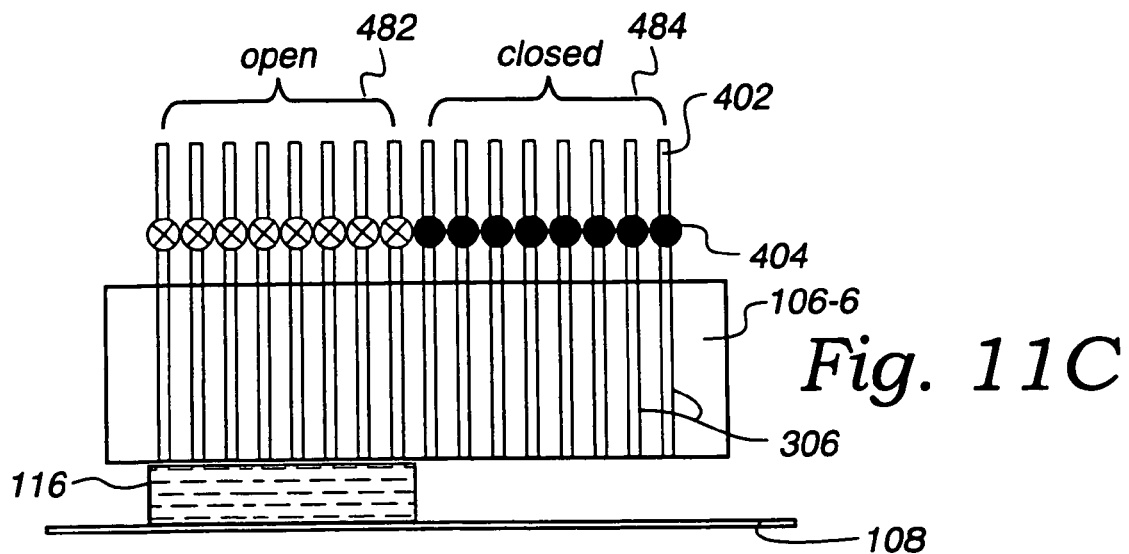
FIG. 11C shows the proximity head in operation where a portion of the plurality of variable flow fluid inputs are turned on in accordance with one embodiment of the present invention.

FIG. 11C shows the proximity head 106-6 in operation where a portion of the plurality of variable flow fluid inputs are turned on in accordance with one embodiment of the present invention. A portion 482 of the plurality of fluid inputs are shown as being open due to the fluid flow control device 404 being set to allow fluid flow through the portion 484 of the plurality of variable flow fluid inputs. A portion 484 of the plurality of variable flow fluid inputs are shown as being closed due to the fluid flow control device 404 being set to stop fluid flow through the portion 482 of the plurality of variable flow fluid inputs. Therefore, the corresponding ones of the plurality of source inlets 306 fed by the portion 484 of the plurality of variable flow fluid inputs apply fluid to the region between the wafer 108 and the proximity head 106-6. The application of fluid to the wafer forms the fluid meniscus 116. In contrast, the portion 484 of the plurality of variable flow fluid inputs do not supply fluid into the corresponding ones of the plurality of source inlets 306 because the fluid flow control device 404 is turned off.

In addition, fluid outputs from the proximity head 106 corresponding to the source inlets may manage fluid flow out of the source inlets defined within the proximity head 106. Therefore, the amount of fluid removed through a particular one or ones of the source outlets may be managed. Therefore, when particular segment of the meniscus is desired to be generated, the corresponding source inlet(s) 306 and the corresponding source outlet(s) 304 (not shown in FIG. 11C) may be activated by enabling fluid flow through the fluid input(s) and output(s) associated with the corresponding source inlet(s) 306 and the corresponding source outlet(s) 304.

Figure 11D:
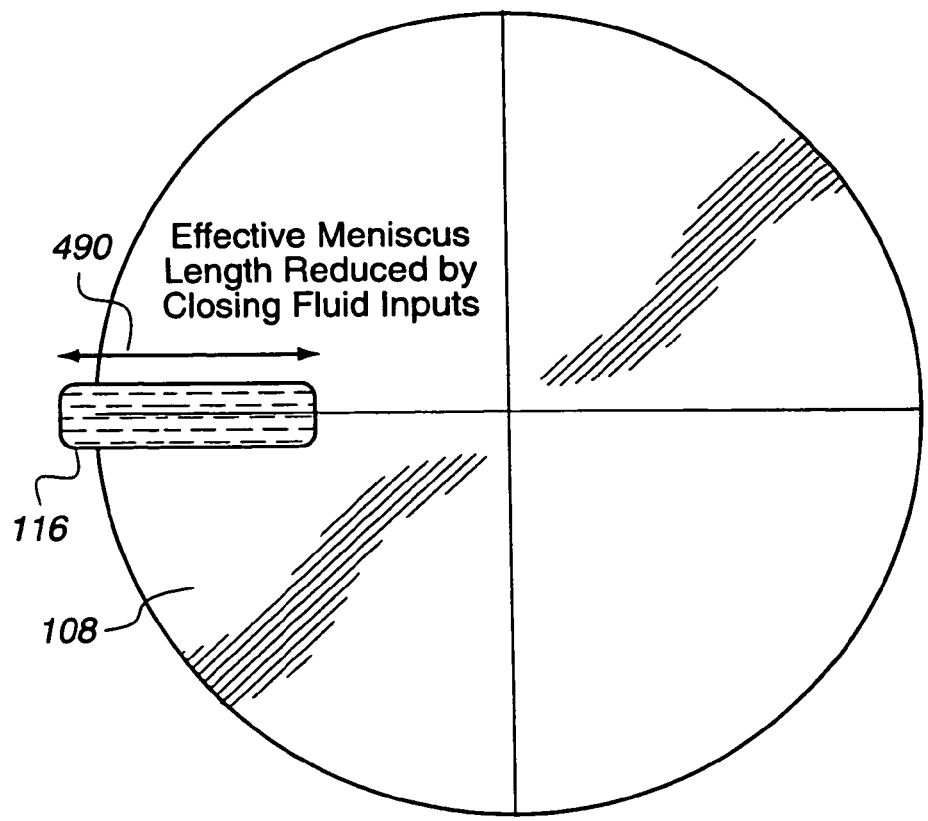
FIG. 11D illustrates the meniscus that is formed by the proximity head with the configuration of the variable flow fluid inputs as shown in FIG. 11C in accordance with one embodiment of the present invention.

FIG. 11D illustrates the meniscus 116 that is formed by the proximity head 106-6 with the configuration of the variable flow fluid inputs 402 as shown in FIG. 11C in accordance with one embodiment of the present invention. The meniscus 116 may be extended or contracted as shown by bidirectional arrow 490. This can be accomplished by turning on and off the fluid flow through the fluid inputs into certain ones of the plurality of source inlets 306. In addition, the fluid flow through the fluid outputs into corresponding ones of the plurality of source outlets 304 may be turned on or off. When one or more segments of the fluid meniscus are desired to be generated, the flow of fluid may be generated through the source inlet(s) 306 and the source outlet(s) 304. When the fluid flow into a particular source inlet is turned on, the meniscus segment supplied by the particular source inlet is formed. Conversely, when the fluid flow into the particular source inlet is turned off, the meniscus segment supplied by the particular source inlet is removed. In one embodiment, the fluid flow out of a particular source outlet is on when fluid flow into a corresponding source inlet is on thereby generating the segment of the meniscus, and the fluid flow out of the particular source outlet is off when the fluid flow into the corresponding source inlet is off thereby removing the segment of the meniscus. Optionally, source inlets 302 may apply IPA/$N_2$ vapor to the border of the fluid meniscus generated on the wafer surface. The fluid inputs for the source outlets 302 may be shut off when the corresponding source inlets 306 and source outlets 304 are shut off thereby turning off the particular fluid meniscus segment. In addition, the fluid inputs for the source outlets 302 maybe turned on when the corresponding source inlets 306 and source outlets 304 are turned on thereby generating the particular meniscus segment.

FIG. 11E illustrates the proximity head 106-6 as discussed in FIG. 11D in operation where the region 484 shows fluid inputs which have their respective fluid flow control devices 404 turned off and the region shows fluid input which have their respective fluid flow control devices 404 turned on in accordance with one embodiment of the present invention. In one embodiment, the region 484 includes fluid inputs 402 each of which corresponds to a segment of meniscus that can be formed. The fluid inputs 402 in the region 482 apply fluid flow into the proximity head 106 corresponding to the source inlets. Each of the source inlets supplied by the fluid inputs 402 can generate a fluid meniscus segment. As shown in FIG. 11E, the segments of the fluid meniscus 116 formed on the wafer 108 correspond to the source inlets that have a positive supply of fluid from the fluid inputs 402 in the region 482. Therefore, by turning any suitable one of the fluid flow control devices 404, any suitable corresponding fluid meniscus segment may be generated due to the application of fluid to the wafer by the corresponding source inlets. As discussed above, the fluid removal from the meniscus through the source outlet 304 corresponding to the segment of the meniscus to be managed may be controlled by adjusting the flow through the fluid output connected to the proximity head.

Figure 11F:
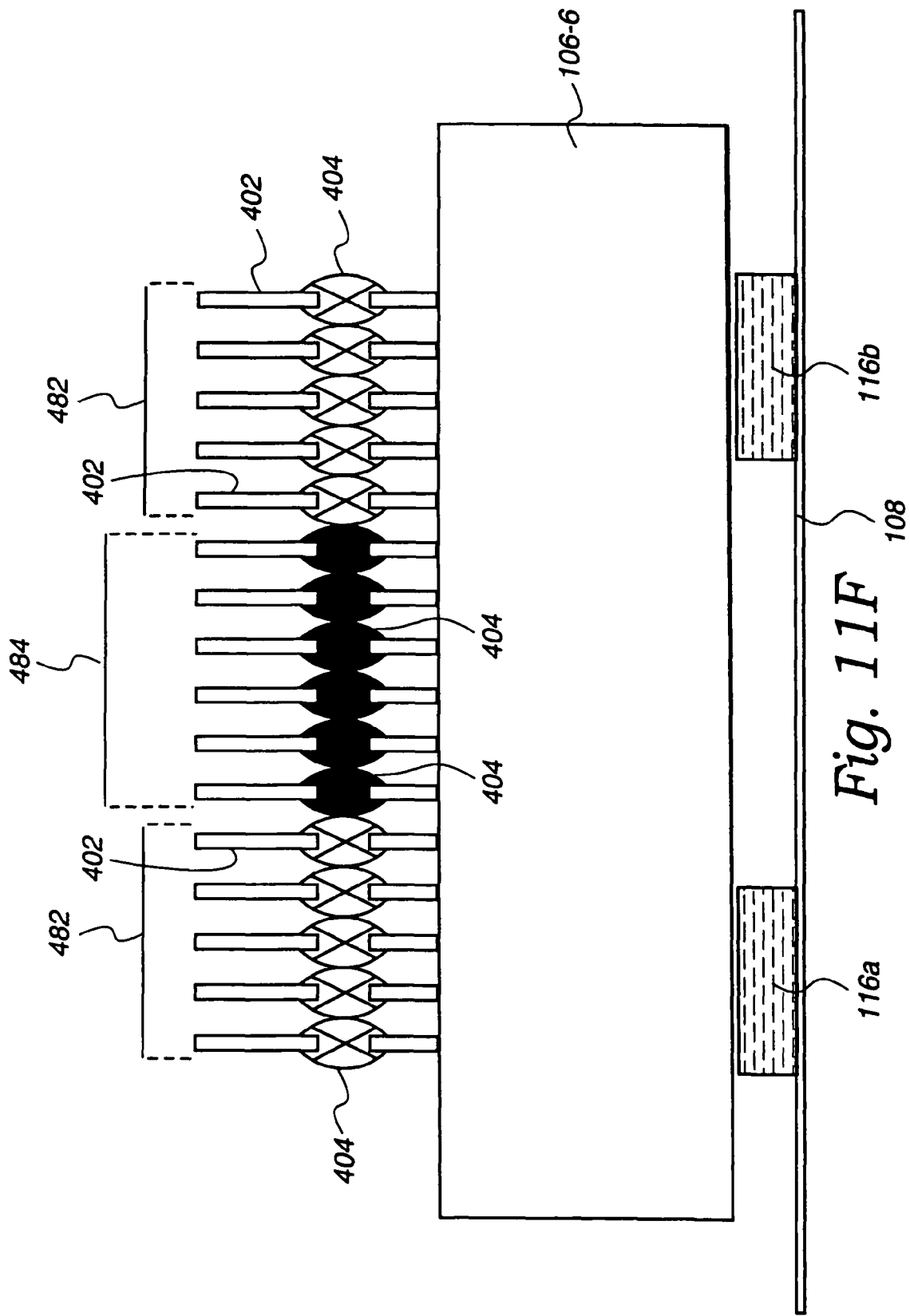
FIG. 11F shows the proximity head in operation illustrating the generation of another exemplary meniscus in accordance with one embodiment of the present invention.

FIG. 11F shows the proximity head 106-6 in operation illustrating the generation of another exemplary meniscus in accordance with one embodiment of the present invention. In the exemplary embodiment shown in FIG. 11F, the fluid inputs 402 in the regions 482 have fluid flow control devices 404 that are allowing fluid flow into corresponding ones of the plurality of source inlets of the proximity head 106 thereby leading to the generation of the menisci 116a and 116b. In addition, the fluid removal from the meniscus through the source outlet 304 corresponding to the segment of the meniscus to be managed may be controlled by adjusting the flow through the fluid output connected to the proximity head.

Figure 11G:
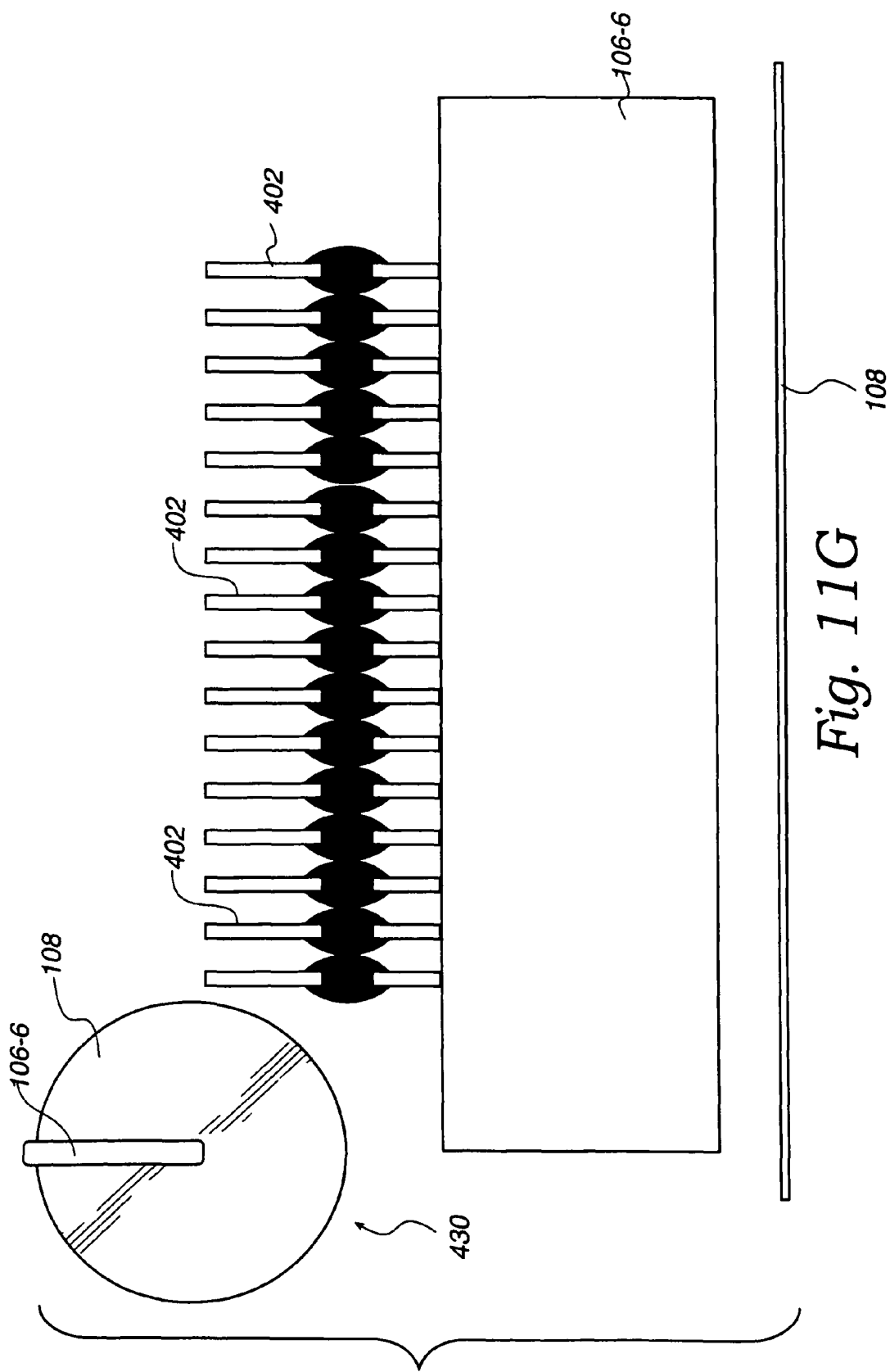
FIG. 11G illustrates the proximity head where no meniscus is formed in accordance with one embodiment of the present invention.

FIG. 11G illustrates the proximity head 106-6 where no meniscus is formed in accordance with one embodiment of the present invention. In one exemplary operation of the proximity head 106-6, the fluid flow control devices 404 are all in the off position. Therefore, no fluid is communicated into the corresponding source inlets of the proximity head 106-6 thereby generating no meniscus because none of the fluid meniscus segments are being fed fluid. In this embodiment, the fluid output from the proximity head 106 may be turned off by stopping fluid flow through the fluid flow control devices 404. Top view 430 shows that no meniscus is formed on the wafer.

Figure 11H:
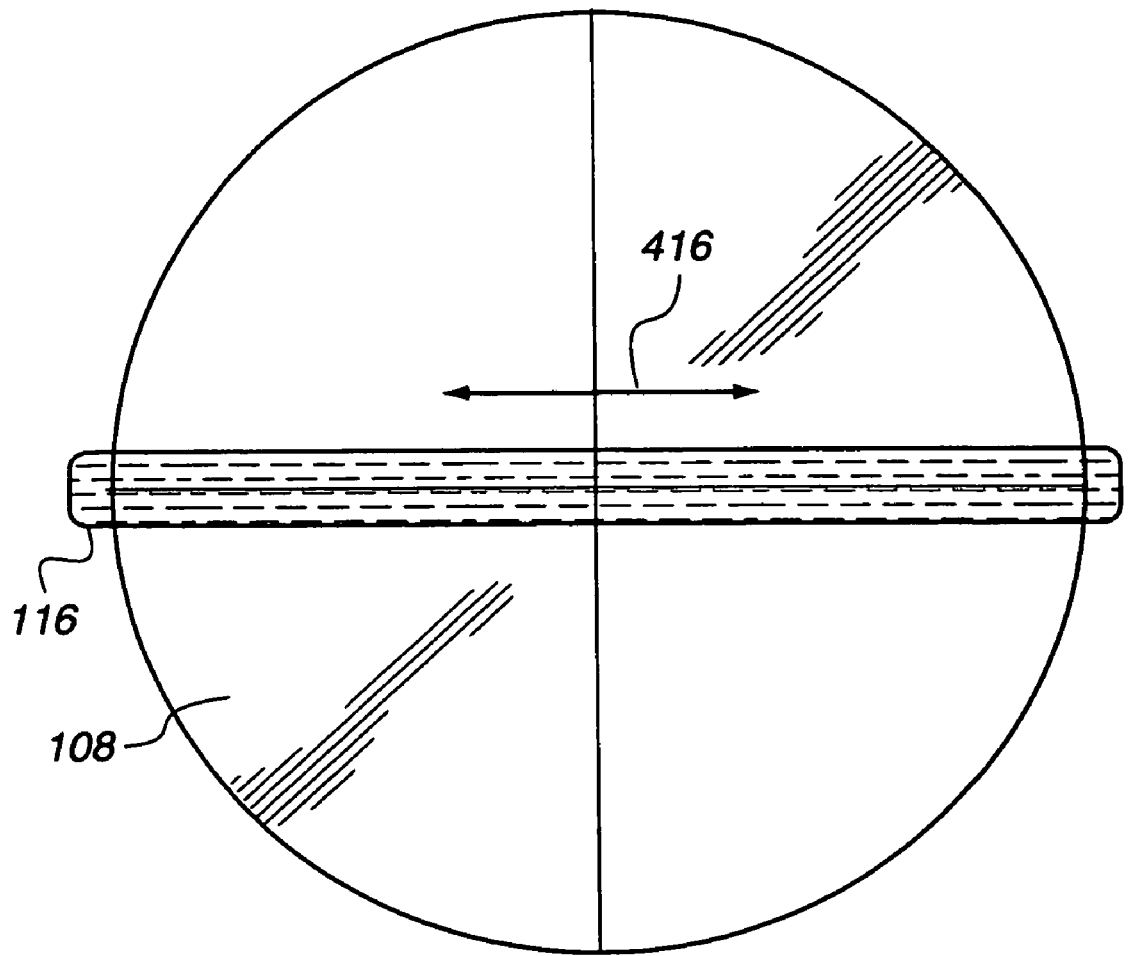
FIG. 11H shows a fluid meniscus that has been formed on the wafer in accordance with one embodiment of the present invention.

FIG. 11H shows a fluid meniscus 116 that has been formed on the wafer 108 in accordance with one embodiment of the present invention. In this embodiment, a proximity head that is longer than a diameter of the wafer is utilized to generate the fluid meniscus 116. It should be appreciated that the size and/or shape of the meniscus can be determined in any suitable number of ways. In one embodiment, the meniscus 116 may extend beyond a diameter of the wafer 108. By turning on or off certain fluid inputs supplying corresponding source inlets 306, certain segments of the meniscus 116 may be generated or removed. Therefore, in one embodiment, without moving the proximity head 106-6, the fluid meniscus 116 may be shortened or extended as shown by the bidirectional arrow 416 depending on which of the source inlets is supplied with fluid (and also depending on which of the source outlets is supplied with vacuum to remove fluid). When the fluid meniscus 116 extends slightly beyond the diameter of the wafer 108 as shown in FIG. 11H, the wafer 108 may be scanned under the proximity head. In another embodiment, the proximity head may form the meniscus 116 on the wafer surface and scan the fluid meniscus 116 over the wafer. In yet another embodiment, the wafer 108 may be rotated one 180 degree rotation which can process the entire wafer surface. In yet another embodiment, the proximity head 106 may cover a region larger than the wafer in which by using selected meniscus generation in different parts of the wafer, all of the wafer surface may be processed without movement of the proximity head 106 or the wafer.

Figure 12A:
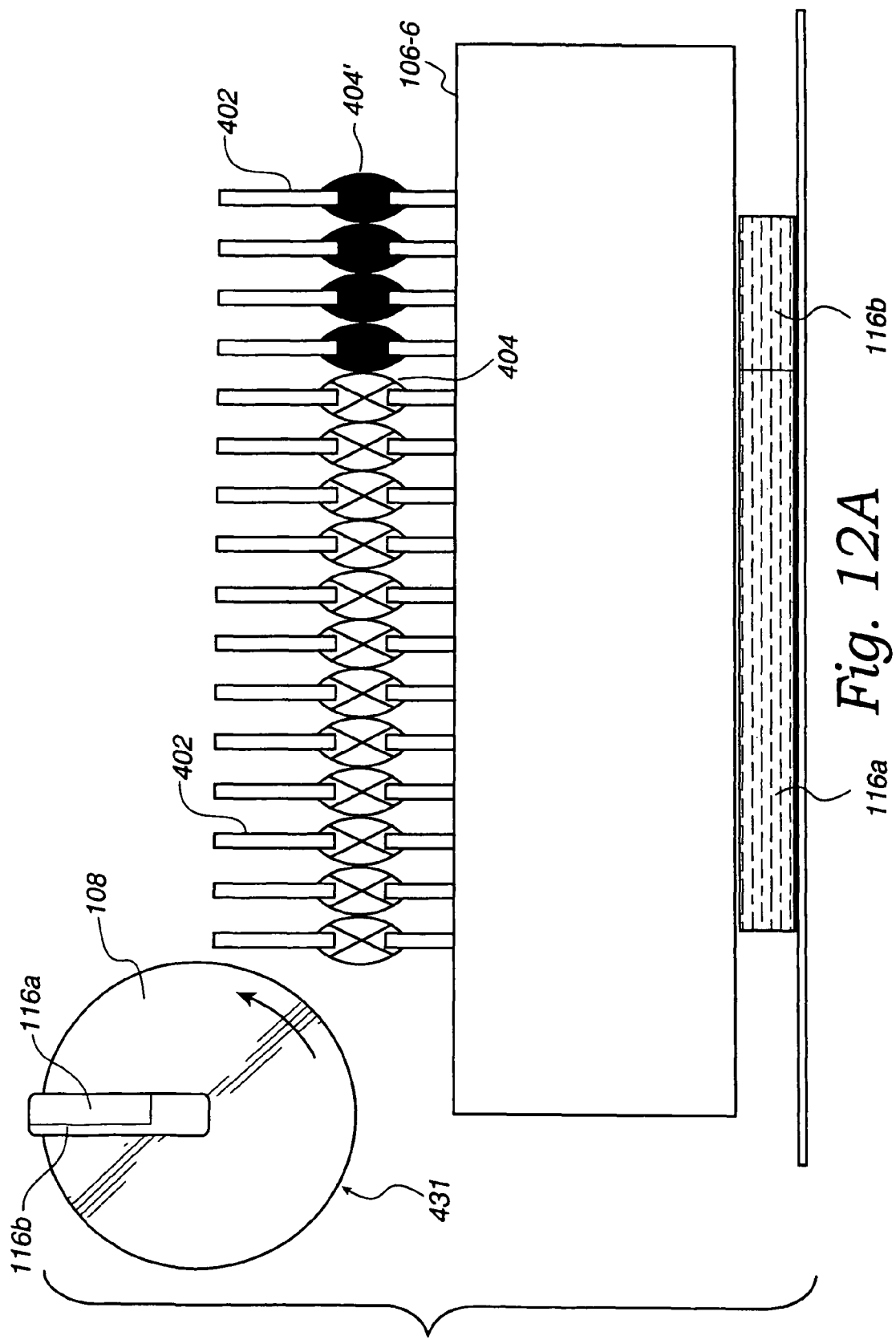
FIG. 12A shows a proximity head producing multiple types of menisci in accordance with one embodiment of the present invention.

FIG. 12A shows a proximity head 106-6 producing multiple types of menisci in accordance with one embodiment of the present invention. In one embodiment, the fluid flow control device 404 may be a multiple fluid valve which can turn fluid flow off, allow a first fluid to flow through the fluid input 402, or allow a second fluid to flow through the fluid input 402. By using the multiple fluid valve, a first fluid may be inputted into the proximity head 106-6 where the corresponding source inlets of the proximity head 106 can apply the first fluid to the proximity head to generate a first fluid meniscus 116a made up of the first fluid. By intelligently managing the multiple fluid valve, after a desired amount of wafer processing has been done by the first fluid meniscus 116a, the multiple fluid valve may allow a second fluid to flow into the corresponding source inlet of the proximity head 106-6. The same source inlets that were applying the first fluid to the wafer can later apply the second fluid to the wafer. As a result, a second fluid meniscus 116b can be formed on the wafer 108. As shown next in FIG. 12B, more of the fluid flow control devices 404 may be managed to allow the second fluid into more of the corresponding source inlets of the proximity head 106-6. Therefore, as more and more of the source inlets apply the second fluid, the second fluid meniscus 116b may become larger. In one exemplary embodiment as shown in FIG. 12A, the meniscus 116b can extend left and the fluid meniscus 116a becomes smaller. In one embodiment, the fluid meniscus 116a may be a chemical meniscus that processes the wafer 108 while the fluid meniscus 116b is a rinse meniscus. Therefore, when a particular segment of the fluid meniscus 116a has processed a corresponding portion of the wafer 108 then that segment of the fluid meniscus can be changed to a segment of the fluid meniscus 116b to rinse the portion of the wafer that was previously processing by a segment the fluid meniscus 116a.

Top view 431 shows one embodiment of how dual menisci processing may be accomplished. The top view 431 shows that the meniscus 116a is within the meniscus 116b and therefore as the meniscus 116a is made smaller by switching flow into corresponding fluid inputs from the first fluid in the meniscus 116a to the second fluid in the meniscus 116b. As the meniscus 116a becomes progressively smaller with each progressive fluid input switching to the second fluid, the meniscus 116b becomes progressively larger and replaces the segments of the 116a that is removed.

Figure 12B:
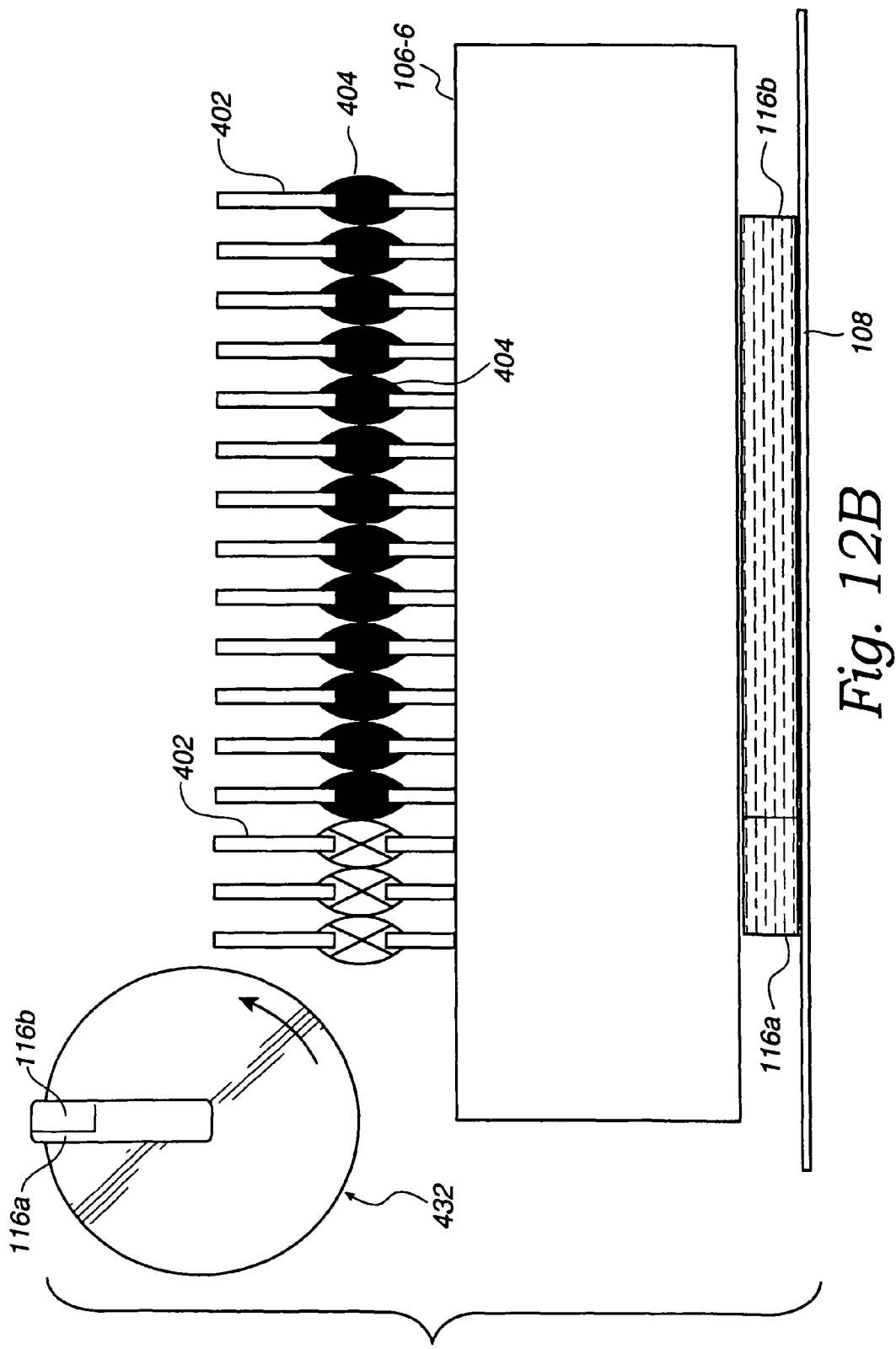
FIG. 12B shows a proximity head where more of the fluid flow control devices 404' allows the second fluid to flow instead of the first fluid in accordance with one embodiment of the present invention.

FIG. 12B shows a proximity head 106-6 where more of the fluid flow control devices 404' allows the second fluid to flow instead of the first fluid in accordance with one embodiment of the present invention. As more and more of the source inlets are supplied with the second fluid instead of the first fluid by the corresponding fluid inputs, more segments of the fluid meniscus 116' are changed to the second fluid meniscus 116b.

Top view 432 shows one embodiment of how dual menisci processing may be accomplished. The top view 432 shows that the meniscus 116a is within the meniscus 116b and therefore as the meniscus 116a is made smaller by switching flow into corresponding fluid inputs from the first fluid in the meniscus 116a to the second fluid in the meniscus 116b. As the meniscus 116a becomes progressively smaller with each progressive fluid input switching to the second fluid, the meniscus 116b becomes progressively larger and replaces the segments of the 116a that is removed.

Figure 13A:
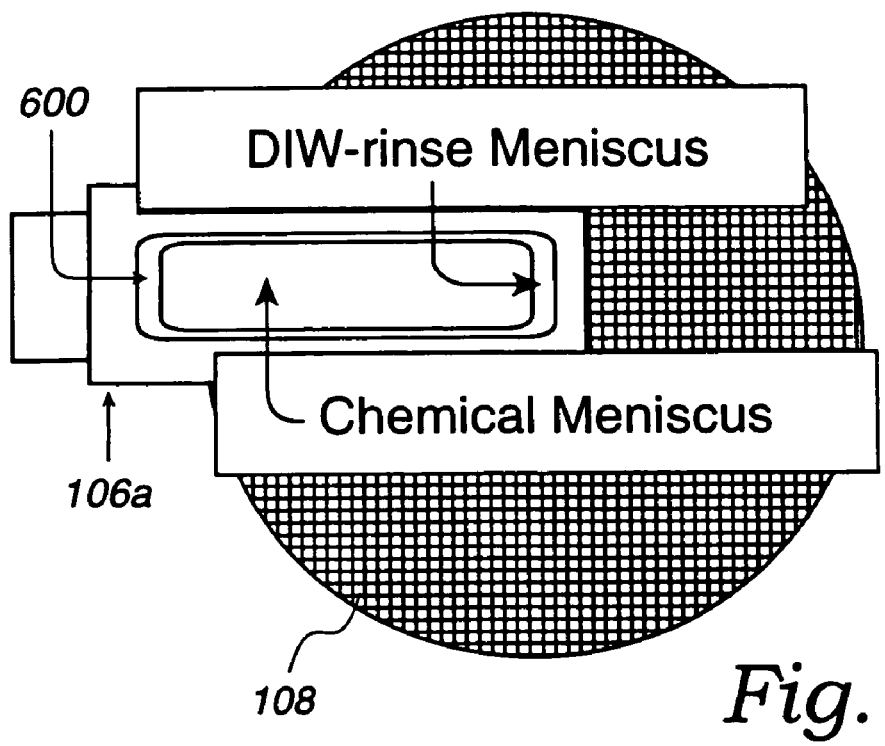
FIG. 13A shows a top view of a multi-menisci proximity head in accordance with one embodiment of the present invention.

FIG. 13A shows a top view of a multi-menisci proximity head 106-6 in accordance with one embodiment of the present invention. In this embodiment, the first fluid meniscus 116a is defined included within the second fluid meniscus 116b. In one embodiment, the first fluid meniscus is a chemical fluid meniscus that can process the wafer in accordance with any suitable wafer processing operation. The second fluid meniscus 116b in one embodiment, may be a rinse fluid meniscus that applies DIW to the wafer to rinse the remnants of the first fluid meniscus 116a from the wafer surface. In one embodiment, by controlling the different segments of the fluid meniscus and determining which processing fluid makes up the segments of the fluid meniscus, different types of wafer processing may be conducted.

In one embodiment, after the first fluid meniscus 116a has been applied to the wafer for a desired period of time, the segments of the first fluid meniscus may be changed to segments of the second fluid meniscus. Therefore, as time progresses, the region of the wafer covered by the second fluid meniscus 116b may increase and the region of the wafer covered by the first fluid meniscus 116a may decrease. Once again, this may be accomplished by managing the fluid flow control device to communicate first fluid to the source inlets of the proximity head 106-6 that corresponds to the fluid meniscus segment where wafer processing is desired. The fluid flow control device may also be managed to communicate the second fluid to the source inlets of the proximity head 106 that corresponds to the fluid meniscus segment where a different wafer processing operation (such as, for example, rinsing) is desired on the corresponding portion of the wafer. View perspective 600 illustrates the perspective from which FIG. 13C is shown.

Figure 13B:
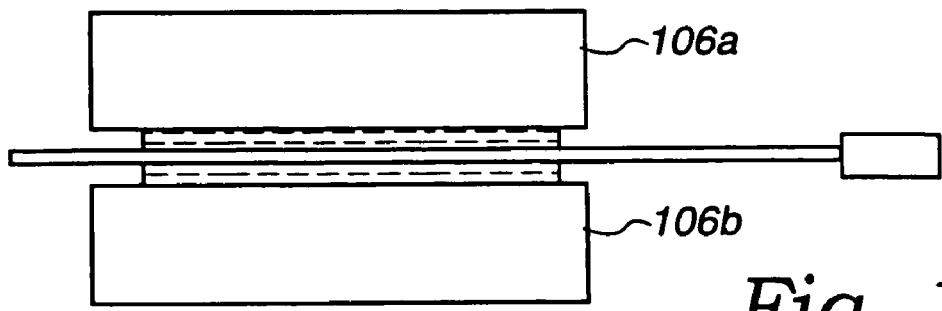
FIG. 13B shows a side view of the dual proximity heads that are processing a top surface and a bottom surface of the wafer in accordance with one embodiment of the present invention.

FIG. 13B shows a side view of the dual proximity heads 106a and 106b that are processing a top surface and a bottom surface of the wafer 108 in accordance with one embodiment of the present invention. In this embodiment, the proximity head 106a and 106b may be the proximity head 106-6 described above in referenced in FIG. 13A with the capability to process portions of the wafer 108 by generating and removing segments of the fluid meniscus 116 on and from the wafer surface. In one embodiment, the adjacent segments of the fluid meniscus 116 be progressively generated to create a growing meniscus or conversely the fluid meniscus 116 may be progressively removed to create a shrinking meniscus. This may be accomplished by progressively turning on fluid flow in each successive adjacent fluid input or by progressively turning off fluid flow in each successive adjacent fluid input.

Figure 13C:
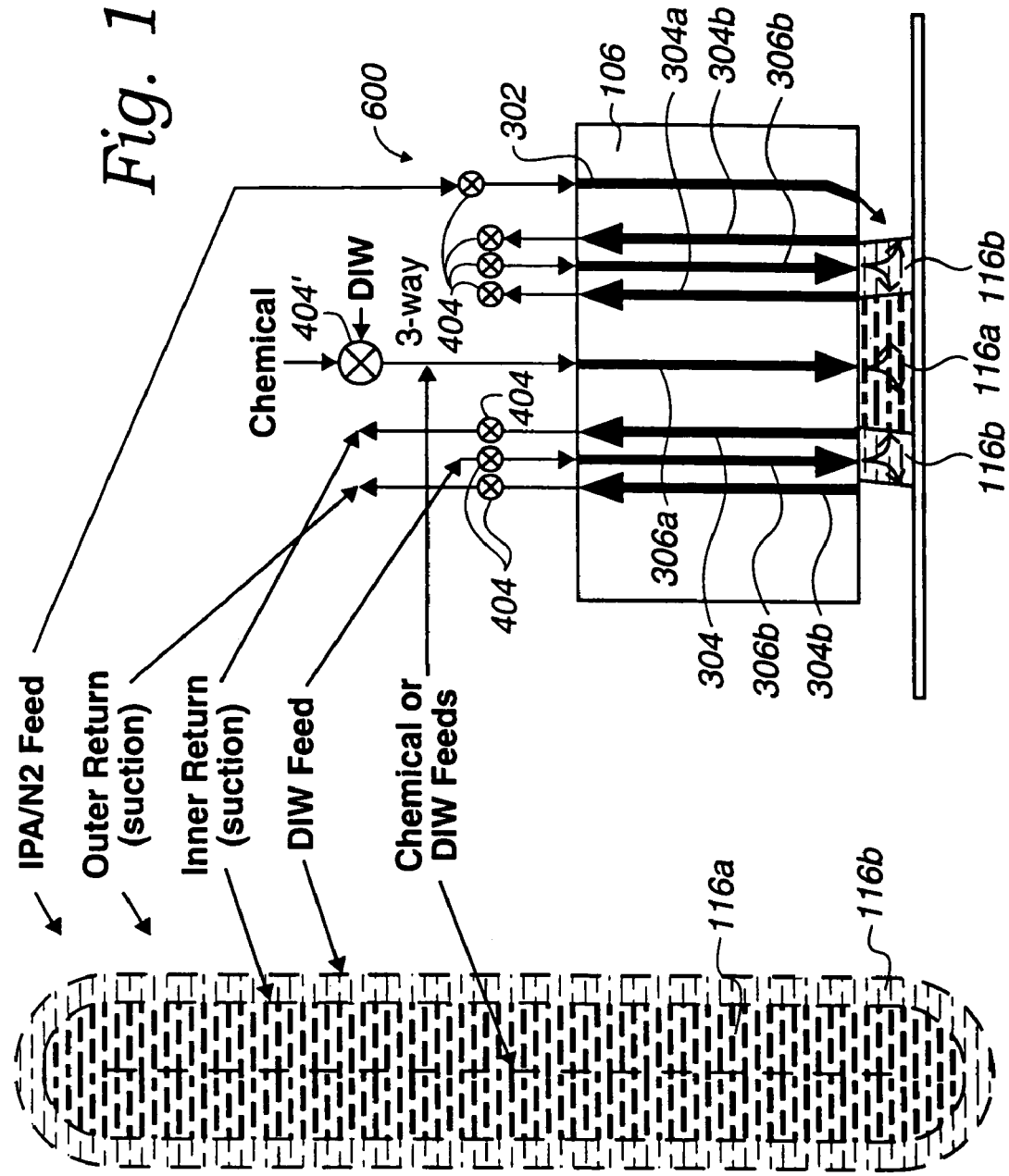
FIG. 13C shows the viewpoint of a side view of a width of the proximity head as shown in FIG. 13A in accordance with one embodiment of the present invention.

FIG. 13C shows the viewpoint 600 of a side view of a width of the proximity head as shown in FIG. 13A in accordance with one embodiment of the present invention. In one embodiment, the fluid flow control device 404' is a three way valve that is configured to be capable of allowing no fluid through the fluid input or allowing one of two fluids into the fluid input supplying the source inlet 306a. In one embodiment, the three-way valve can allow either of a chemical or DIW through the fluid input. The chemical may be any suitable solution that may process the wafer in a desired operation. The proximity head 106 can include any one of the suitable the conduit patterns as discussed above in reference to the multi-menisci proximity heads. Therefore, the source inlet 306a can apply a first fluid to the wafer and therefore generate the fluid meniscus 116a. The first fluid may be removed from the wafer surface through the source outlets 304a. The source inlet 306b can apply a second fluid to the wafer and therefore generate the fluid meniscus 116b that is concentric to the fluid meniscus 116a. The second fluid may be removed from the wafer surface through the source outlets 304b. Source inlet 302 may optionally be used to apply a surface tension reducing fluid when control of surface tension of the border of the fluid meniscus 116a is desired. In addition to fluid inputs supplying the source inlets 306a may also include the fluid flow control device 404 for fluid supply control. The fluid outputs removing fluid from the source outlets 304a and 304b may also include the fluid flow control devices 404 for fluid removal control.

Figure 14A:
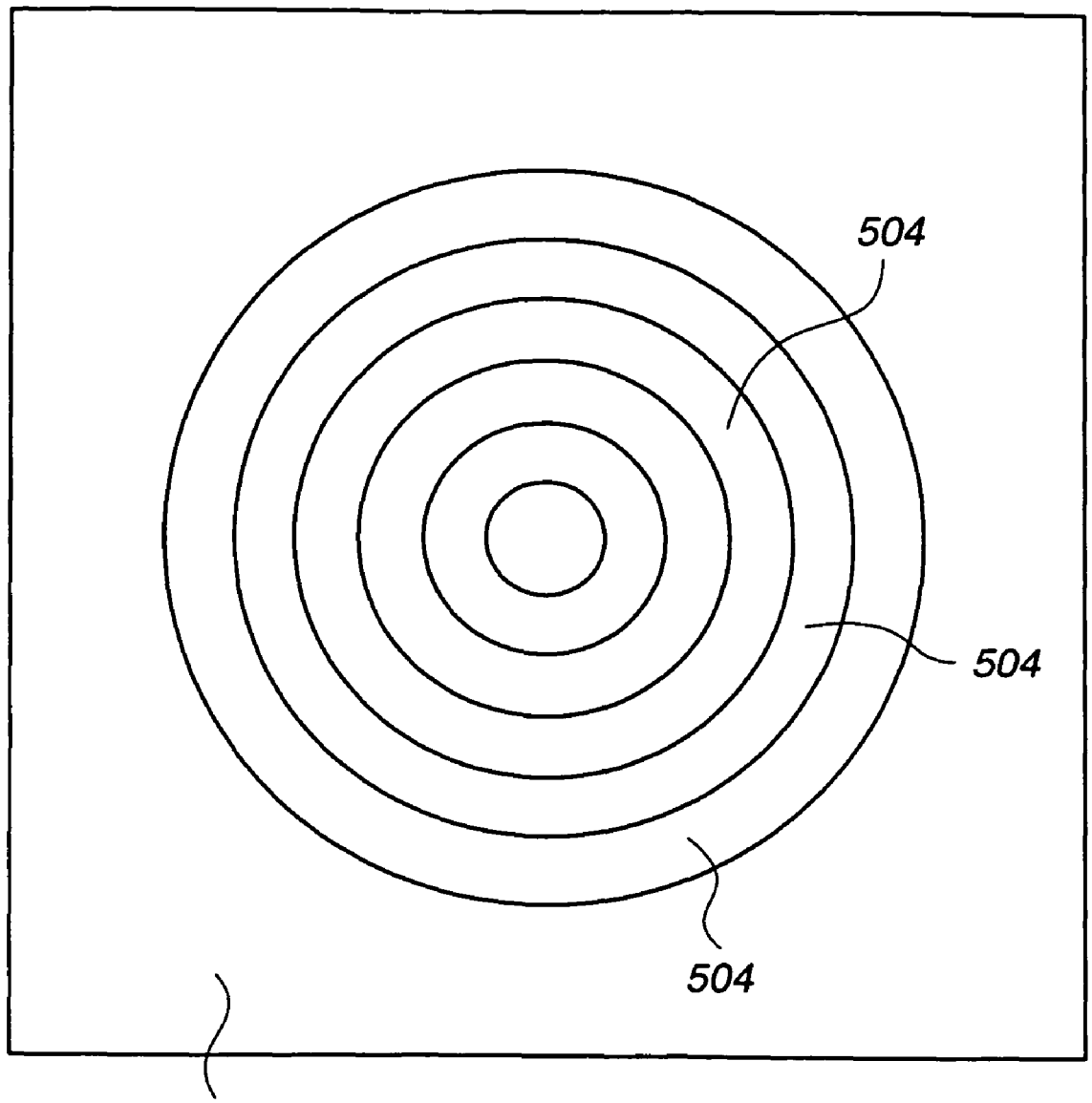
FIG. 14A shows a proximity head that is capable of generating a substantially circular fluid meniscus in accordance with one embodiment of the present invention.
Figure 14B:
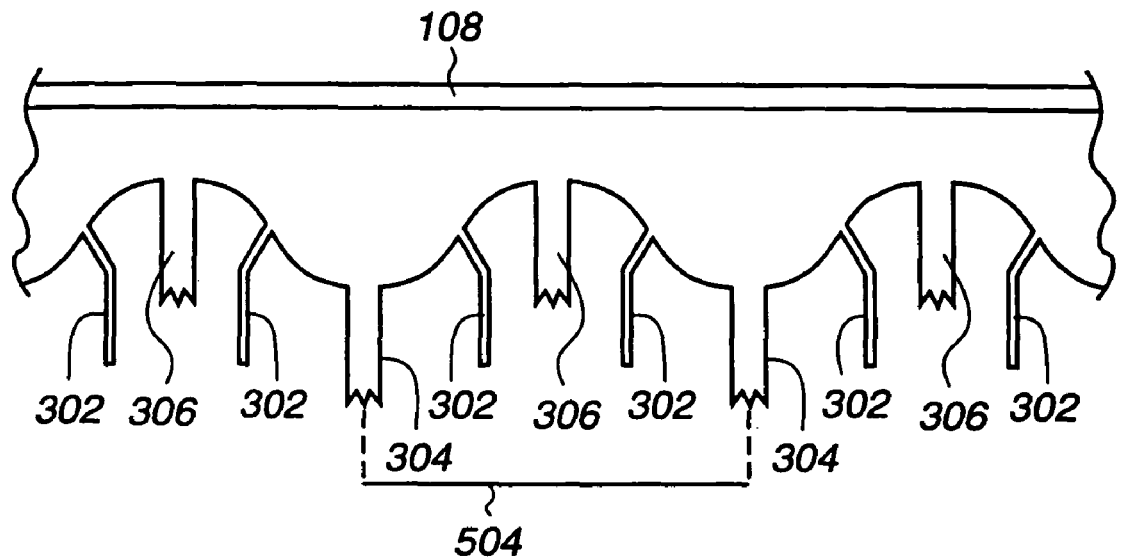
FIG. 14B shows a side perspective view along a radius of the circular regions in the proximity head operating on an underside of the wafer in accordance with one embodiment of the present invention.

FIG. 14A shows a proximity head 106-7 that is capable of generating a substantially circular fluid meniscus in accordance with one embodiment of the present invention. In one embodiment, the proximity head 106-7 having concentric regions 504. Each of the concentric regions 504 of the proximity head 106-7 can generate a segment of a fluid meniscus. Each of the concentric regions includes a concentric plurality of source inlets 302, a concentric plurality of source inlets 306, and a concentric plurality of source outlets 304 (as shown in FIG. 14B). Therefore, each of the regions 504 can generate a circular fluid meniscus on the wafer surface corresponding to the shape and size of the regions 504.

FIG. 14B shows a side perspective view along a radius of the circular regions 504 in the proximity head 106-7 operating on an underside of the wafer 108 in accordance with one embodiment of the present invention. In one embodiment, the proximity head 106''' includes a plurality of regions 504 each of which can generate a fluid meniscus. The side view of the proximity head 106-7 shows that along a radius of the regions 504 (as seen in FIG. 14A), each of the regions include a source inlet 306, adjacent to source inlets 302 which are in turn adjacent to source outlets 304. In one embodiment, the source inlet 306 can apply a processing fluid to the wafer. The source inlets 302 may apply a surface tension reducing fluid to the processing fluid applied to the wafer by the source inlet 306. The source outlets 304 may remove the fluid applied to the wafer surface by the source inlet 306. By the application of the processing fluid to the wafer, the application of a surface tension reducing fluid to the fluid on the wafer, and the removal of the fluid from the surface of the wafer, a stable fluid meniscus may be generated.

Fluid inputs that supply the source inlets 306 may include the fluid flow control device that can control the flow of fluid through the fluid inputs thereby controlling the flow of fluid through the source inlets 306. Fluid outputs (as shown in FIG. 10D) that remove the fluid from the source outlets 304 can include the fluid flow control device that can control the flow of fluid through the fluid outputs thereby controlling the flow of fluid through the source outlets 304.

Figure 14C:
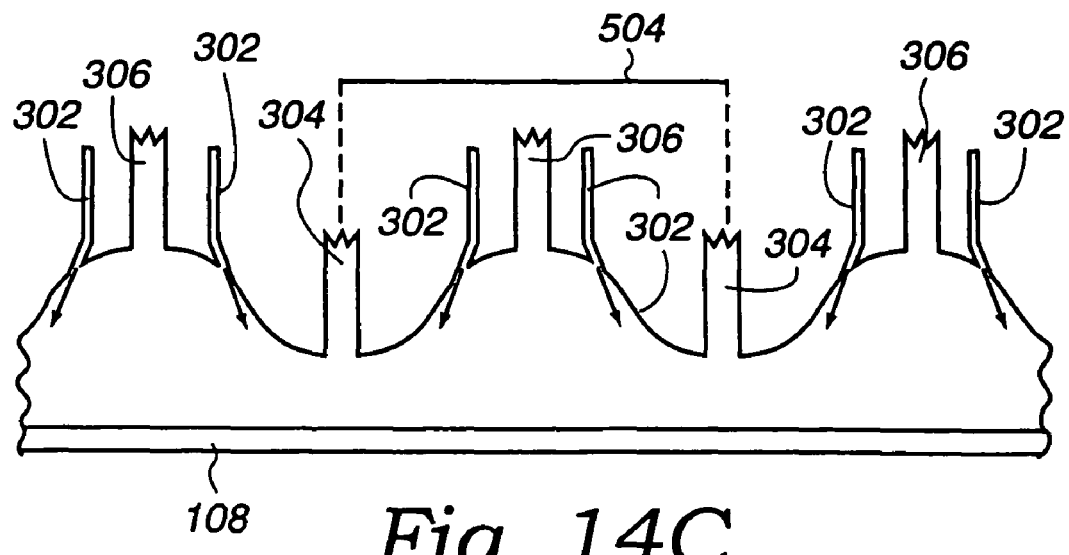
FIG. 14C illustrates an analogous structure as shown in FIG. 14B that is in position to process a top surface of the wafer 108 in accordance with one embodiment of the present invention.

FIG. 14C illustrates an analogous structure as shown in FIG. 14B that is in position to process a top surface of the wafer 108 in accordance with one embodiment of the present invention. In this embodiment, the proximity head 106-7 is located below the wafer 108 and the proximity head 106-7 can process the bottom surface of the wafer 108 in accordance with the methodologies described herein.

Figure 15:
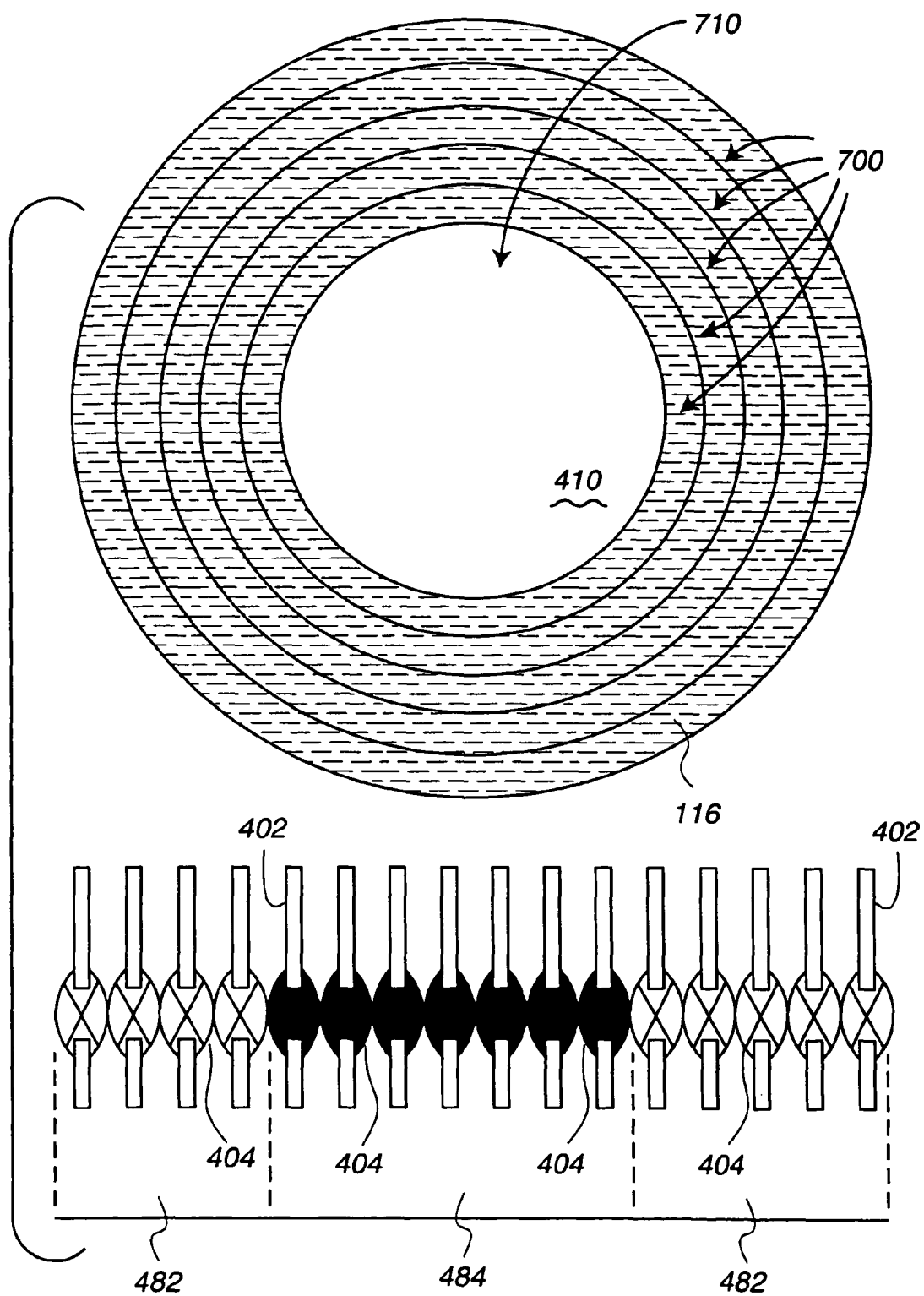
FIG. 15 illustrates management of concentric fluid menisci in accordance with one embodiment of the present invention.

FIG. 15 illustrates management of concentric fluid menisci in accordance with one embodiment of the present invention. In one embodiment, each of the concentric regions of the proximity head 106-7 that has the source inlets 306 may be supplied with fluid from the fluid inputs 402. The fluid flow control device 404 for each of the fluid inputs 402 may be open or closed depending on whether a corresponding source inlet 306 is desired to be supplied with fluid. When the source inlet 306 is supplied with fluid from the fluid input 402, the source inlet 306 applies the fluid to the wafer surface in a region between the source inlet 306 and the wafer surface.

In the exemplary embodiment shown in FIG. 15, the fluid inputs 404 within the region 482 are open which in turn generates fluid menisci segments 700. The fluid inputs 404 within the region 484 are closed which in turn does not generate fluid menisci segments 710. Therefore, in the fluid meniscus pattern shown in FIG. 15 is similar to a ring.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for processing a surface of a substrate through a proximity head having a proximity head surface, comprising:
   applying fluid onto the surface of the substrate from a portion of a plurality of inlets of the proximity head; and
   removing the fluid from the surface of the substrate from a portion of a plurality of outlets of the proximity head, the removing being processed as the fluid is applied to the surface, and the portion being controllably selected to be all or fewer than the plurality of inlets and outlets by flow controlling particular ones of the plurality of inlets and outlets;
   wherein the applying the fluid and the removing the fluid forms a segment of a fluid meniscus along a length of the proximity head on the surface of the substrate based on the flow controlling of particular ones of the plurality of inlets and outlets, the segment of the fluid meniscus being defined between the surface of the proximity head and the surface of the substrate, the flow controlling being facilitated by restrictors aligned along the length of the proximity head for setting either an on flow, an off flow or partial flow through selected ones of the plurality of inlets and outlets.

2. A method for processing a substrate as recited in claim 1, further comprising:
   processing the surface of the substrate with the segment of the fluid meniscus, the processing occurring by exposing the surface of the substrate to the fluid meniscus; and
   moving the segment of the fluid meniscus over different portions of the surface of the substrate.

3. A method for processing a substrate as recited in claim 2, wherein processing the surface of the substrate with the segment of the fluid meniscus includes one of an etching operation, a cleaning operation, a rinsing operation, a plating operation, a drying operation, or a lithography operation.

4. A method for processing a substrate as recited in claim 1, further comprising:
   generating additional segments of the fluid meniscus.

5. A method for processing a substrate as recited in claim 4, wherein the generating additional segments of the fluid meniscus includes,
   applying an additional fluid onto a surface of the substrate from a different portion of a plurality of inlets; and
   removing at least the additional fluid from the surface of the substrate, the removing being processed as the additional fluid is applied to the surface.

6. A method for processing a substrate as recited in claim 1, wherein the fluid is one of a lithographic fluid, an etching fluid, a plating fluid, a cleaning fluid, a drying fluid, or a rinsing fluid.

7. A method for processing a substrate as recited in claim 1, further comprising,
   applying a surface tension reducing fluid to the surface of the substrate.

8. A method for processing a substrate as recited in claim 7, wherein the surface tension reducing fluid is an isopropyl alcohol vapor in nitrogen gas.

9. A method for processing a substrate as recited in claim 1, wherein the application of the fluid onto the surface of the substrate from at least one inlet is managed by controlling fluid flow to the at least one inlet.

10. A method for processing a substrate as recited in claim 9, wherein controlling fluid flow defines one of an on position or an off position, the on position allowing fluid flow into at least one corresponding inlet, and the off position stopping fluid flow into the at least one corresponding inlet.

11. A method for processing a substrate using a proximity head, comprising:
    applying fluid onto a surface of the substrate from a portion of a plurality of inlets of the proximity head; and
    removing the fluid from the surface of the substrate through a portion of a plurality of outlets of the proximity head, the removing being processed as the fluid is applied to the surface, and the applying of the fluid and the removing the fluid forms a segment of a fluid meniscus on the surface of the substrate, as defined by the portion of the plurality of inlets and outlets, the portion of the plurality of inlets and outlets being controllably selected by placing certain ones of the plurality of inlets and outlets in one of an on or off position by flow controlling particular ones of the plurality of inlets and outlets;
    wherein placing certain ones of the plurality of inlets and outlets in the off positions reduces a size of the segment of the fluid meniscus, and placing certain ones of the plurality of inlets and outlets in the on position increases the size of the segment of the fluid meniscus, wherein flow controlling is facilitated by restrictors that place the certain ones of the inlets and outlets in the off or on position, the fluid meniscus being defined between the surface of the substrate and a surface of the proximity head that has the plurality of inlets and plurality of outlets.

12. The method for processing a substrate using a proximity head as recited in claim 11, wherein placing certain ones of the plurality of inlets and outlets in the off position closes fluid communication, thus defining the size of the meniscus across a length of the proximity head, when placed over the surface of the substrate.

13. The method for processing a substrate using a proximity head as recited in claim 11, further comprising:
    applying a surface tension changing gas through outlets of the proximity head, the surface tension changing gas being applied adjacent to the segment of the meniscus during the application onto the surface of the substrate.

* * * * *